United States Patent
Iwahashi (12)

(10) Patent No.: US 6,178,116 B1
(45) Date of Patent: Jan. 23, 2001

(54) MEMORY CELL OF NON-VOLATILE SEMICONDUCTOR MEMORY DEVICE

(75) Inventor: Hiroshi Iwahashi, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/550,791

(22) Filed: Apr. 17, 2000

Related U.S. Application Data

(62) Division of application No. 09/305,479, filed on May 6, 1999, now Pat. No. 6,072,748, which is a continuation of application No. 08/901,660, filed on Jul. 28, 1997, now Pat. No. 6,058,051, which is a division of application No. 08/731,914, filed on Oct. 22, 1996, now Pat. No. 5,745,413, which is a division of application No. 08/433,071, filed on May 3, 1995, now Pat. No. 5,596,525, which is a division of application No. 08/288,219, filed on Aug. 9, 1994, now Pat. No. 5,448,517, which is a continuation of application No. 08/115,100, filed on Sep. 2, 1993, now abandoned, which is a continuation of application No. 07/913,451, filed on Jul. 15, 1992, now Pat. No. 5,270,969, which is a continuation of application No. 07/685,650, filed on Apr. 16, 1991, now Pat. No. 5,148,394, which is a continuation of application No. 07/212,649, filed on Jun. 28, 1988, now Pat. No. 5,008,856.

(30) Foreign Application Priority Data

| Jun. 29, 1987 | (JP) | ................................................ 62-161625 |
| Jun. 30, 1987 | (JP) | ................................................ 62-163023 |
| Dec. 23, 1987 | (JP) | ................................................ 62-325686 |

(51) Int. Cl.[7] .................................................. G11C 16/04
(52) U.S. Cl. ............................... 365/185.18; 365/185.11; 365/185.23
(58) Field of Search .......................... 365/185.18, 185.23, 365/185.11

(56) References Cited

U.S. PATENT DOCUMENTS

| 4,099,196 | 7/1978 | Simko . |
| 4,203,158 | 5/1980 | Frohman-Bentchkowsky et al. . |
| 4,233,526 | 11/1980 | Kurogi et al. . |

(List continued on next page.)

FOREIGN PATENT DOCUMENTS

| 61-225862 | 10/1961 | (JP) . |
| 53-148256 | 12/1978 | (JP) . |
| 55-153195 | 11/1980 | (JP) . |
| 57-71587 | 5/1982 | (JP) . |
| 60-182162 | 9/1985 | (JP) . |
| 62-103900 | 5/1987 | (JP) . |
| WO84/02800 | 7/1984 | (WO) . |

OTHER PUBLICATIONS

H.N. Kotecha. "Electrically Alterable Non–Volatile Logic Circuits", IBM Technical Disclosure Bulletin, vol. 24, No. 7B, Dec. 1981, pp. 3811–3812.

R. Stewart et al., "A High Density EPROM Cell and Array", Symposium on VLSI Technology Digest of Technical Papers, pp. 89–90, May 1986.

E. Adler, "Densely Arrayed EEPROM Having Low–Voltage Tunnel Write", IBM Technical Disclosure Bulletin, vol. 27, No. 6, Nov. 1984, pp. 3302–3307.

Prince and Due–Gundersen, "Semiconductor Memories", 1983, pp. 136–139.

\* cited by examiner

*Primary Examiner*—Huan Hoang
(74) *Attorney, Agent, or Firm*—Finnegan, Henderson, Farabow, Garrett, & Dunner, L.L.P.

(57) ABSTRACT

The current paths of a plurality of floating gate type MOSFETs are series-connected to form a series circuit. The series circuit is connected at one end to receive a reference voltage, and is connected to data programming and readout circuit. In the data programming mode, electrons are discharged from the floating gate to the drain of the MOSFET or holes are injected into the drain into the floating gate. The data readout operation is effected by checking whether current flows from the other end to the one end of the series circuit or not.

15 Claims, 25 Drawing Sheets

U.S. PATENT DOCUMENTS

| | | |
|---|---|---|
| 4,344,005 | 8/1982 | Stewart . |
| 4,425,632 | 1/1984 | Iwahashi et al. . |
| 4,447,895 | 5/1984 | Asano . |
| 4,467,453 | 8/1984 | Chiu et al. . |
| 4,500,975 | 2/1985 | Shirato . |
| 4,503,522 | 3/1985 | Etoh et al. . |
| 4,506,350 | 3/1985 | Asano et al. . |
| 4,580,247 | 4/1986 | Adam . |
| 4,597,062 | 6/1986 | Asano et al. . |
| 4,601,020 | 7/1986 | Arakawa et al. . |
| 4,648,074 | 3/1987 | Pollachek . |
| 4,758,984 * | 7/1988 | Yoshida ................................ 365/185 |
| 4,775,958 | 10/1988 | Hasimoto . |
| 4,805,150 | 2/1989 | Asano et al. . |
| 4,811,292 | 3/1989 | Watanabe . |
| 4,901,281 | 2/1990 | Yoshida et al. . |
| 4,939,690 | 7/1990 | Momodomi et al. . |
| 5,008,856 | 4/1991 | Iwahashi . |
| 5,148,394 | 9/1992 | Iwahashi . |
| 5,270,969 | 12/1993 | Iwahashi . |
| B1 4,509,148 | 1/1996 | Asano et al. . |

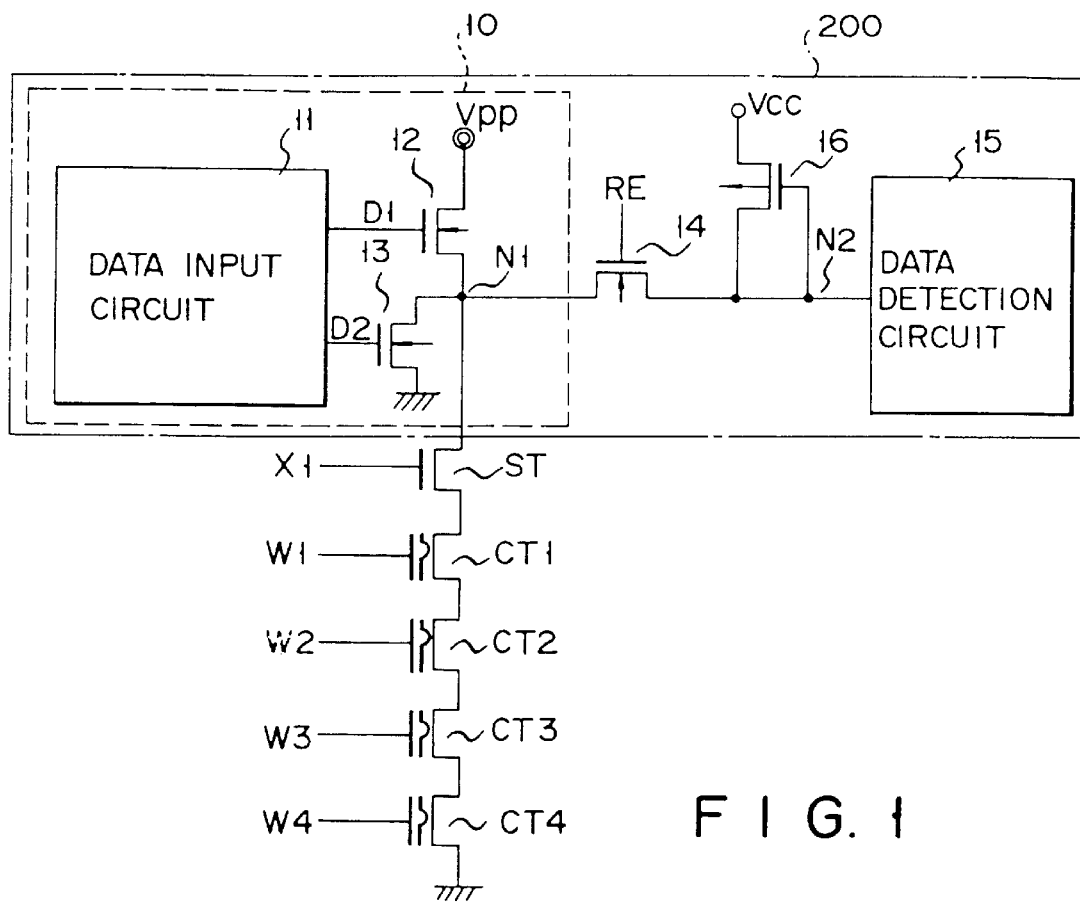
F I G. 1
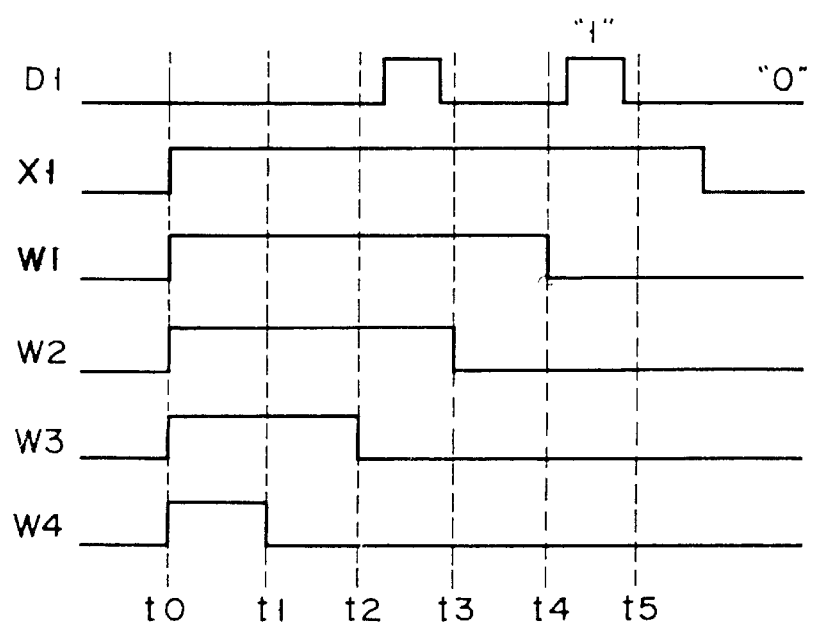
F I G. 2

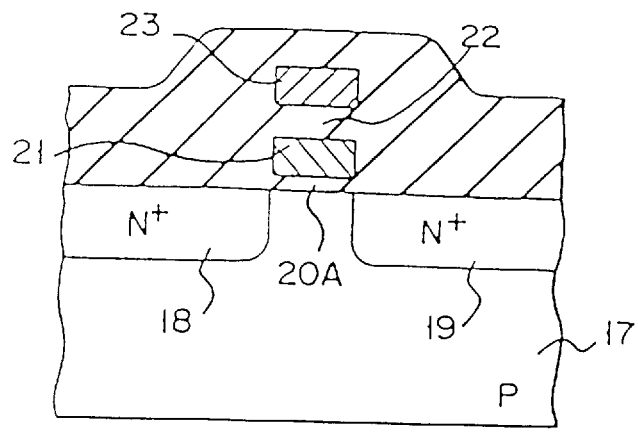
F I G. 4C
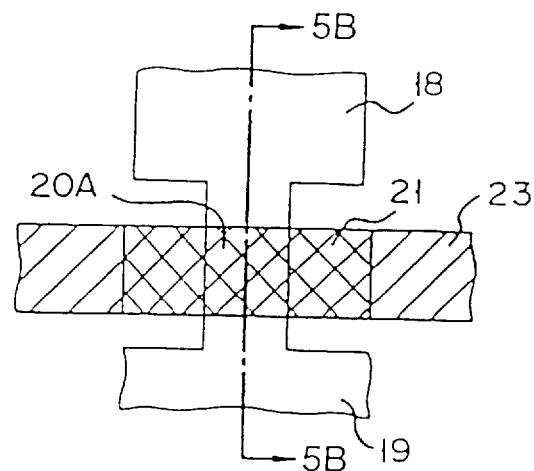
F I G. 5A
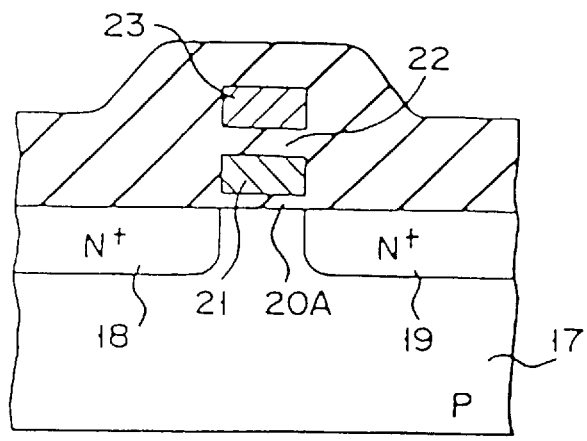
F I G. 5B

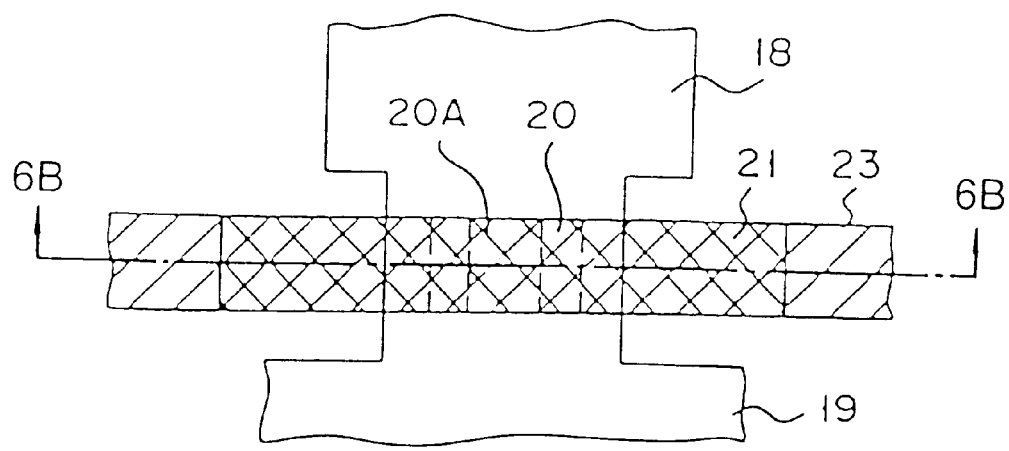
F I G. 6A
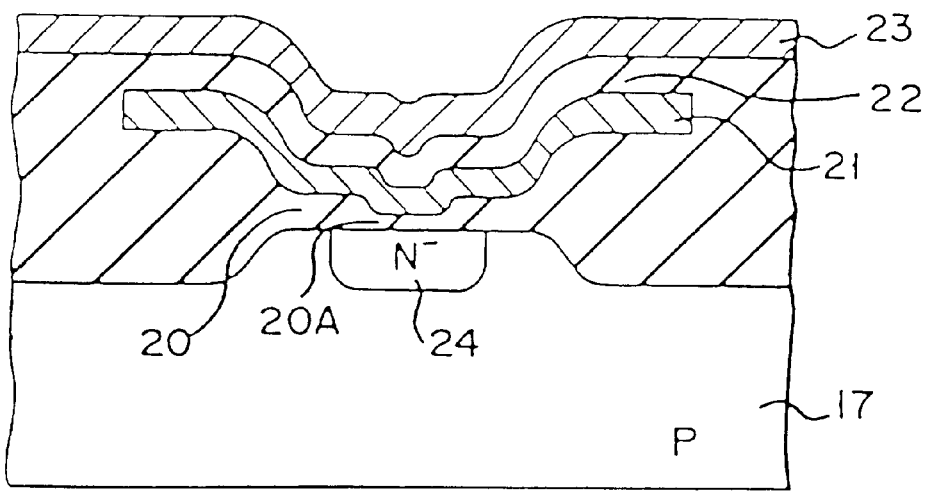
F I G. 6B

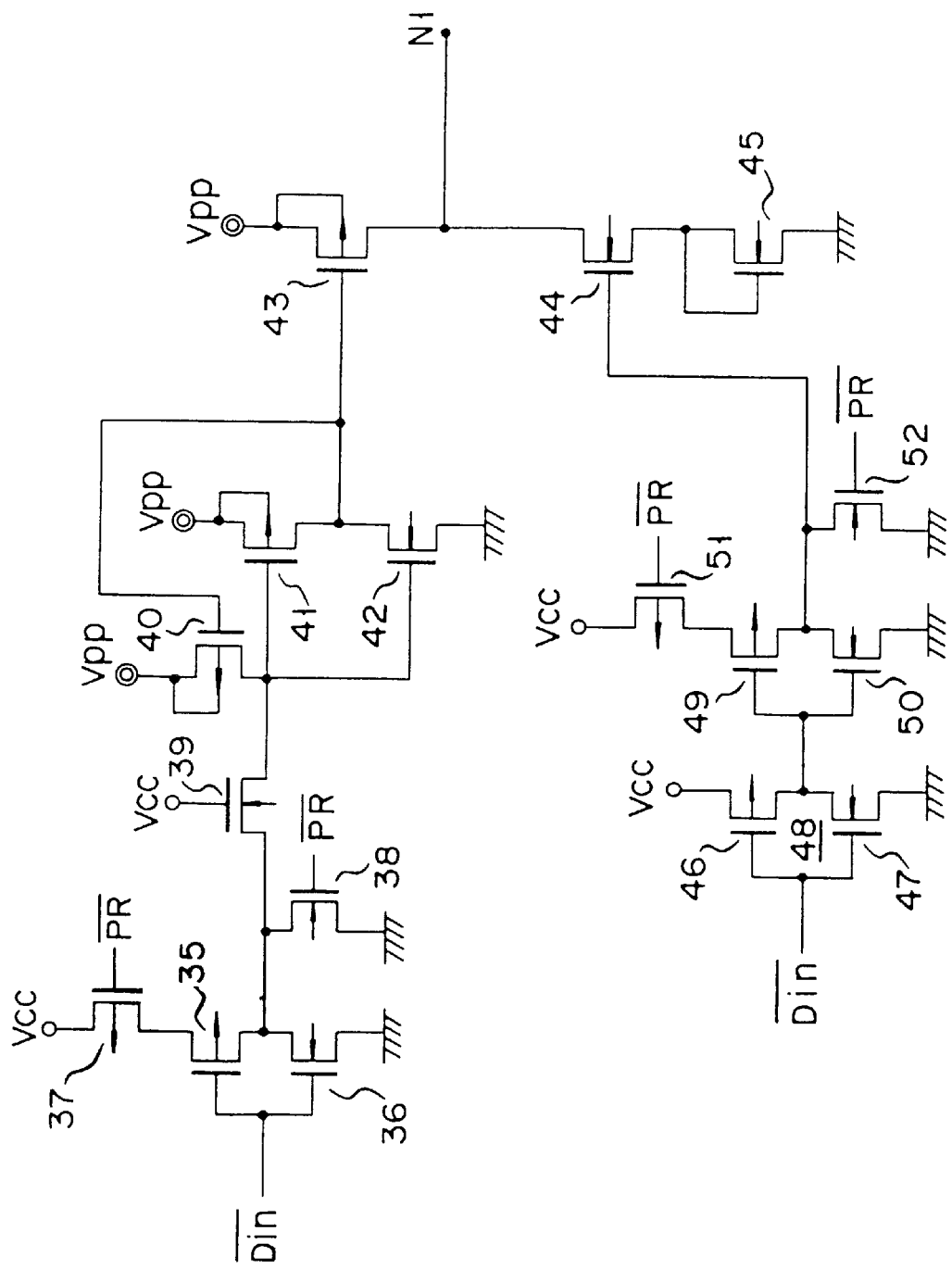
F I G. 9

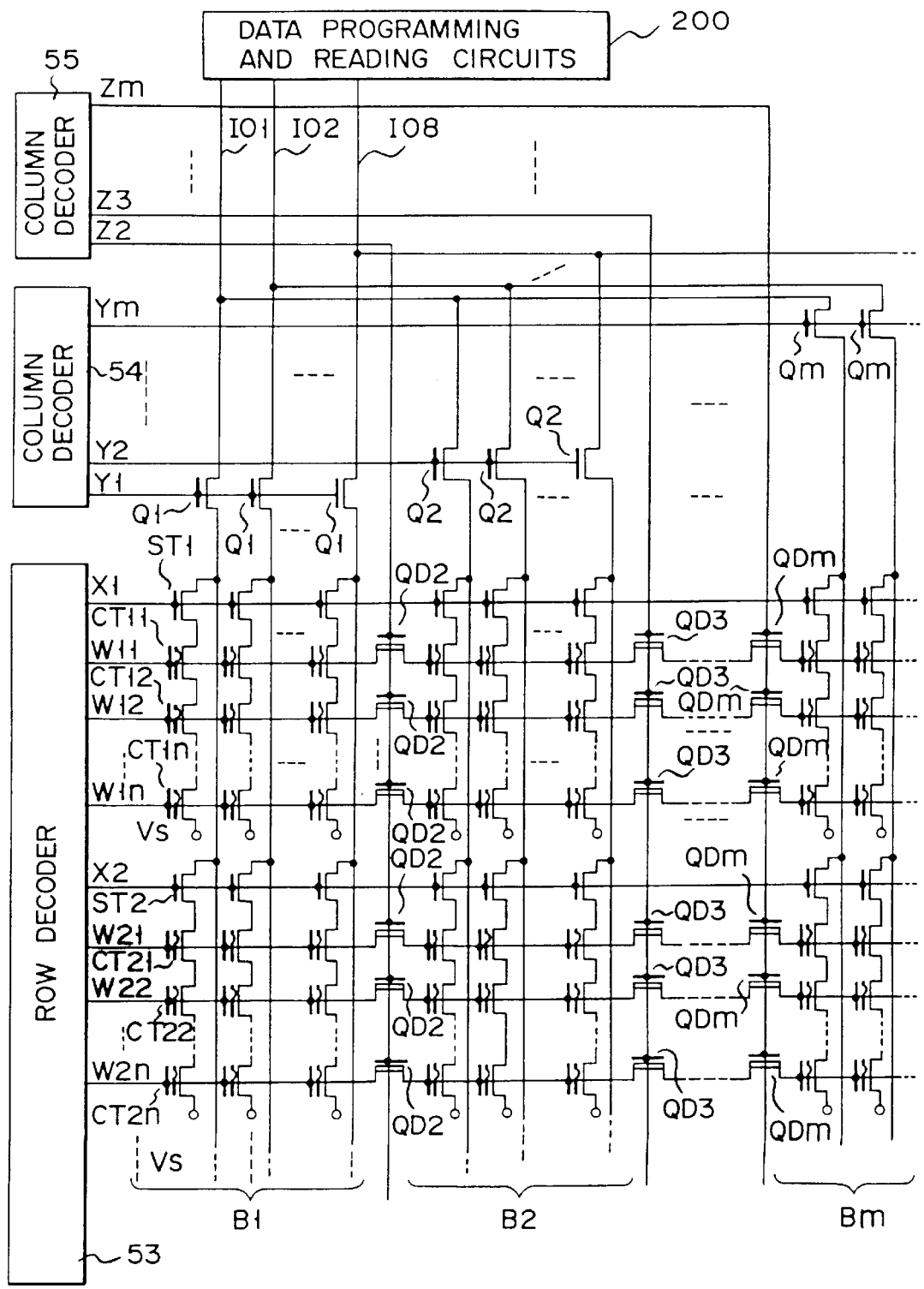
F I G. 10

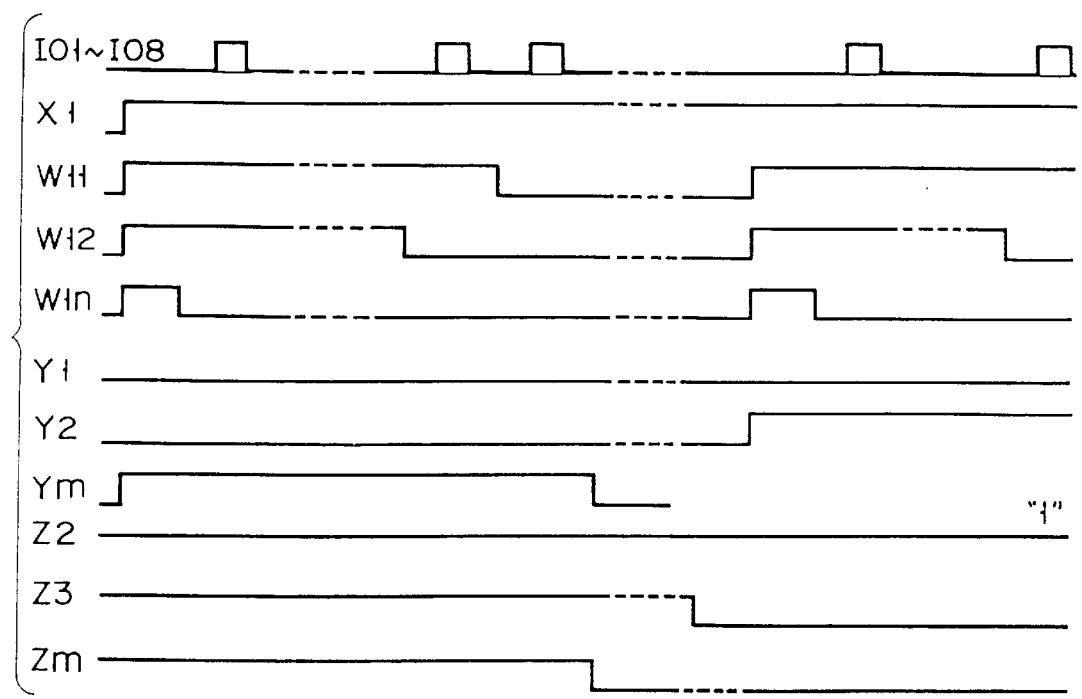
F I G. 11
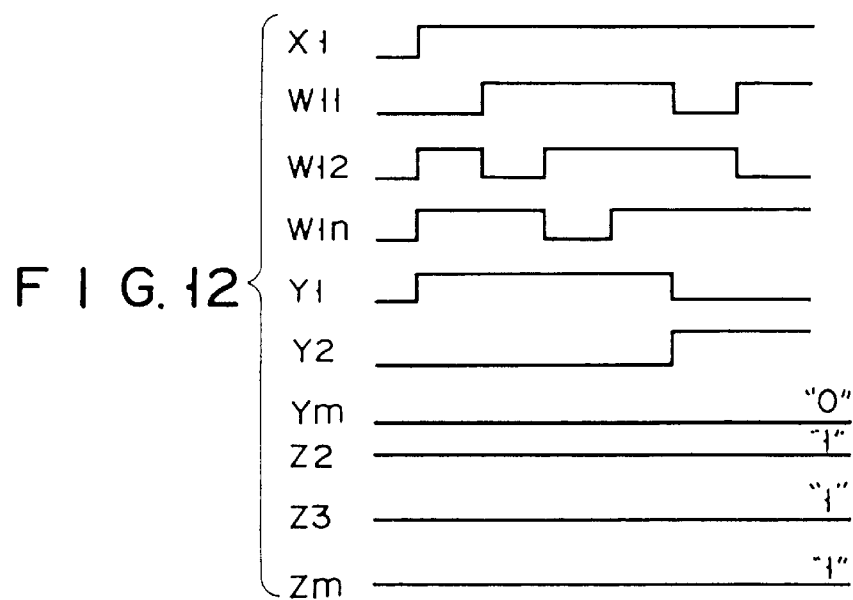
F I G. 12

| I | RE | A0 | A1 | W11 | W12 | W13 | W14 |
|---|----|----|----|-----|-----|-----|-----|
| 0 | 1  | 0  | 0  | 1   | 1   | 1   | 0   |
| 0 | 1  | 1  | 0  | 1   | 1   | 0   | 1   |
| 0 | 1  | 0  | 1  | 1   | 0   | 1   | 1   |
| 0 | 1  | 1  | 1  | 0   | 1   | 1   | 1   |
| 1 | 1  | 0  | 0  | 1   | 1   | 1   | 0   |
| 1 | 1  | 1  | 0  | 1   | 1   | 0   | 1   |
| 1 | 1  | 0  | 1  | 1   | 0   | 1   | 1   |
| 1 | 1  | 1  | 1  | 0   | 1   | 1   | 1   |
| 0 | 0  | 0  | 0  | 1   | 1   | 1   | 0   |
| 0 | 0  | 1  | 0  | 1   | 1   | 0   | 0   |
| 0 | 0  | 0  | 1  | 1   | 0   | 0   | 0   |
| 0 | 0  | 1  | 1  | 0   | 0   | 0   | 0   |
| 1 | 0  | 0  | 0  | 1   | 1   | 1   | 1   |
| 1 | 0  | 1  | 0  | 1   | 1   | 1   | 1   |
| 1 | 0  | 0  | 1  | 1   | 1   | 1   | 1   |
| 1 | 0  | 1  | 1  | 1   | 1   | 1   | 1   |

F I G. 13

| A0 | A1 | A2 | X1 | X2 | W11 | W12 | W13 | W14 | W21 | W22 | W23 | W24 |
|----|----|----|----|----|-----|-----|-----|-----|-----|-----|-----|-----|
| 0  | 0  | 0  | 1  | 0  | 1   | 1   | 1   | 0   | 0   | 0   | 0   | 0   |
| 1  | 0  | 0  | 1  | 0  | 1   | 1   | 0   | 1   | 0   | 0   | 0   | 0   |
| 0  | 1  | 0  | 1  | 0  | 1   | 0   | 1   | 1   | 0   | 0   | 0   | 0   |
| 1  | 1  | 0  | 1  | 0  | 0   | 1   | 1   | 1   | 0   | 0   | 0   | 0   |
| 0  | 0  | 1  | 0  | 1  | 0   | 0   | 0   | 0   | 1   | 1   | 1   | 0   |
| 1  | 0  | 1  | 0  | 1  | 0   | 0   | 0   | 0   | 1   | 1   | 0   | 1   |
| 0  | 1  | 1  | 0  | 1  | 0   | 0   | 0   | 0   | 1   | 0   | 1   | 1   |
| 1  | 1  | 1  | 0  | 1  | 0   | 0   | 0   | 0   | 0   | 1   | 1   | 1   |

F I G. 14

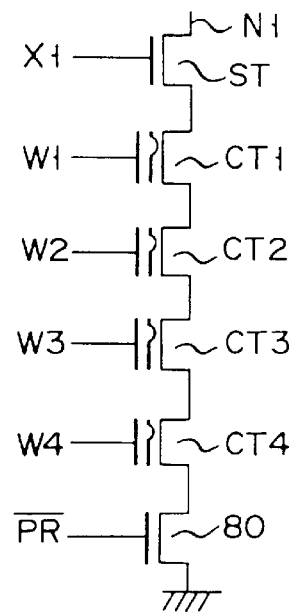
F I G. 16
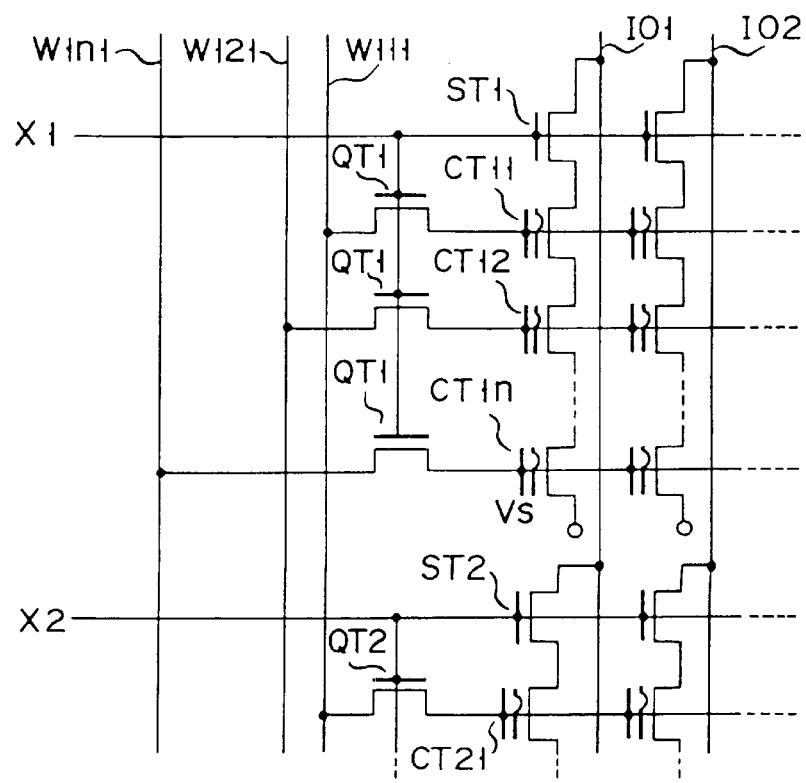
F I G. 17

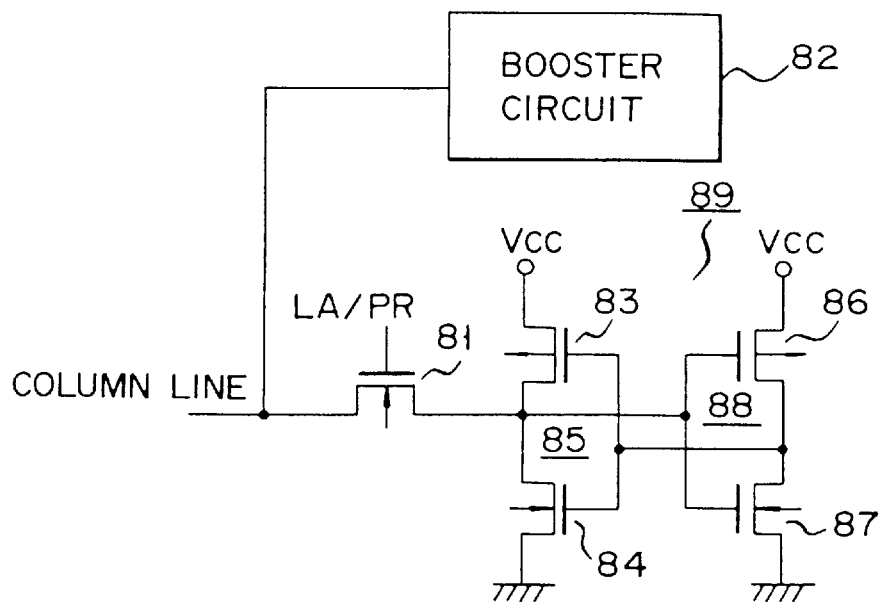
F I G. 18A
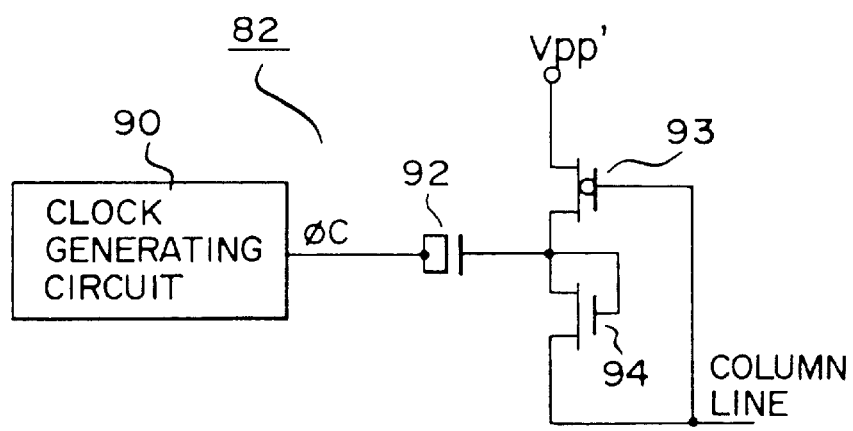
F I G. 18B

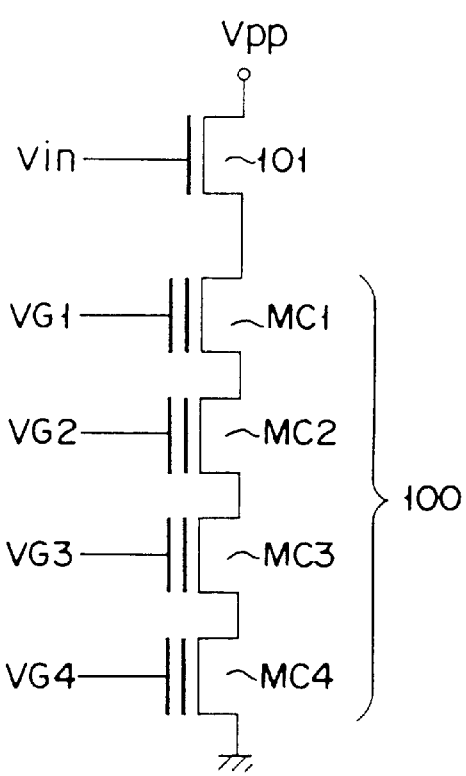
F I G. 19
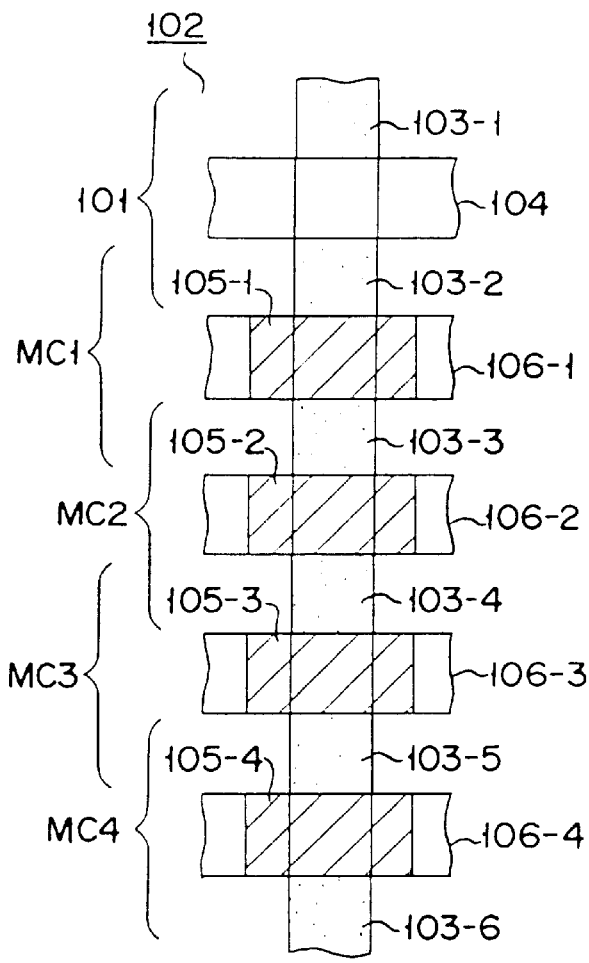
F I G. 20

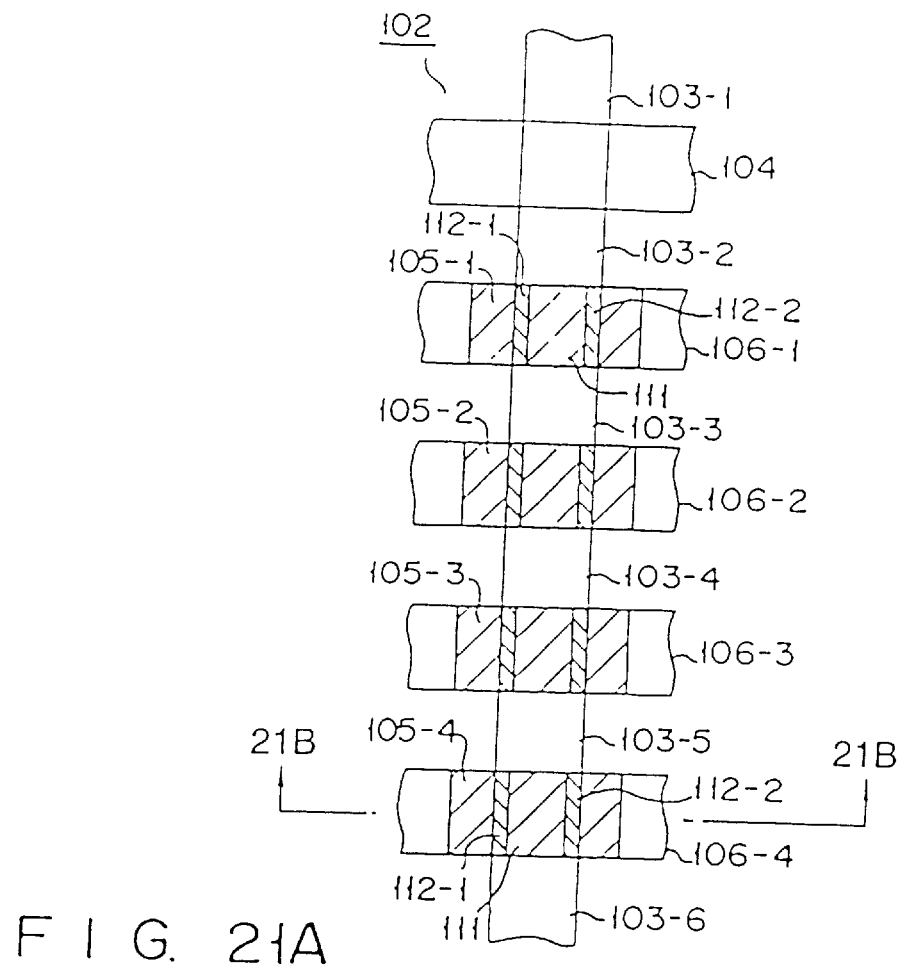
F I G. 21A
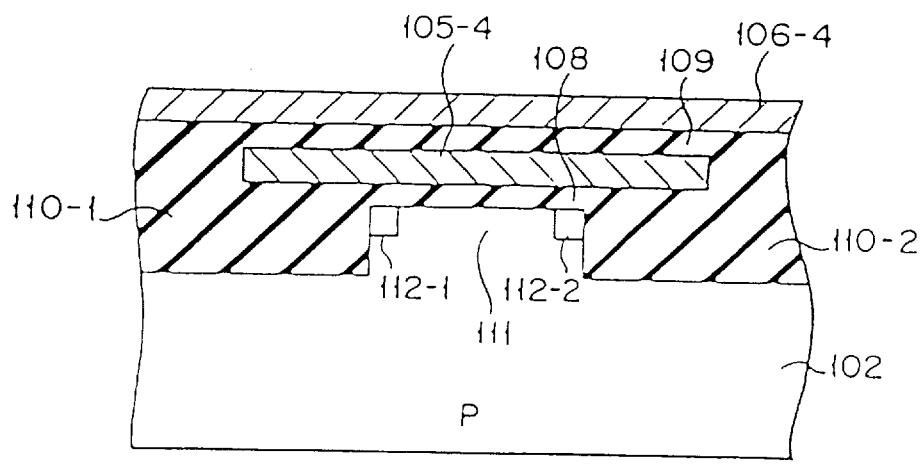
F I G. 21B

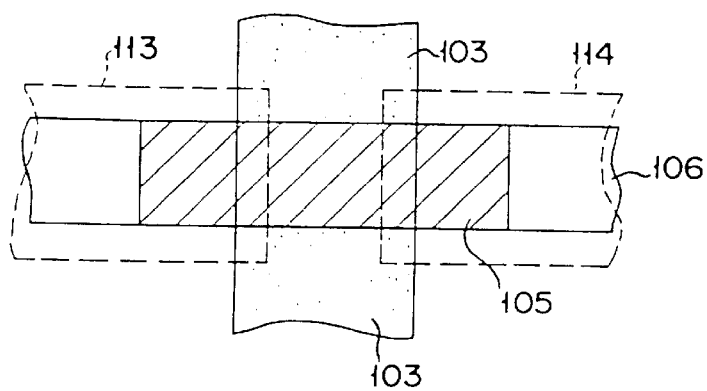
F I G. 22
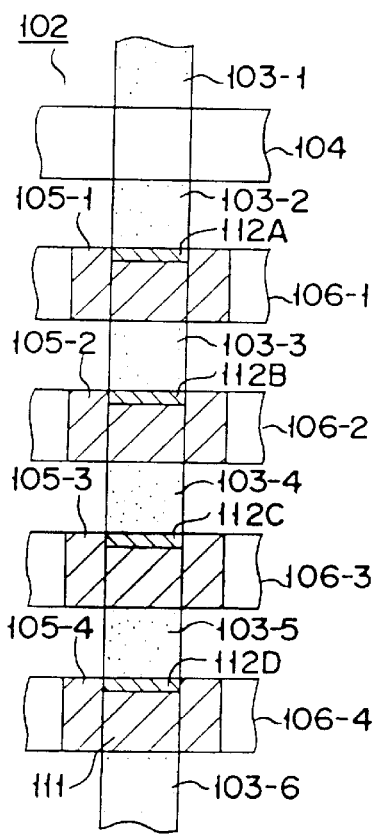
F I G. 23
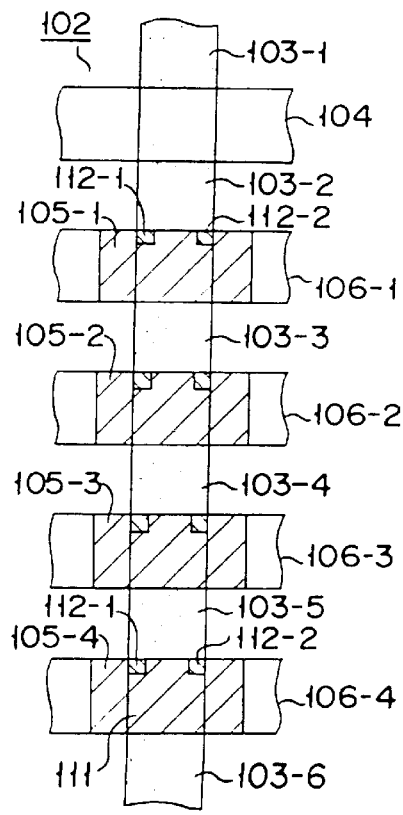
F I G. 24

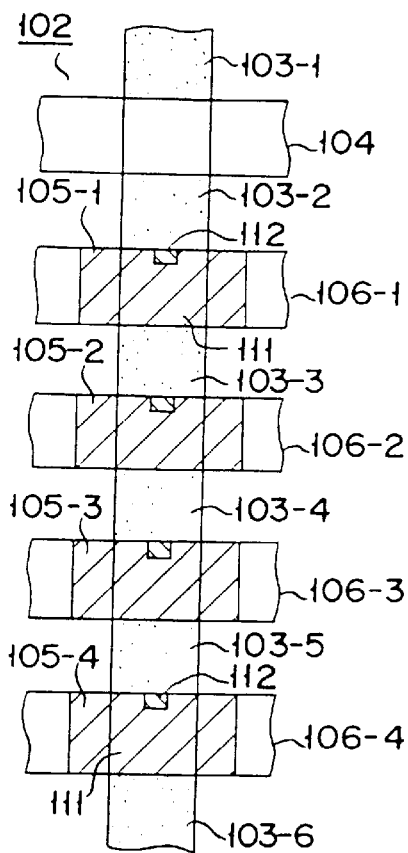
F I G. 25
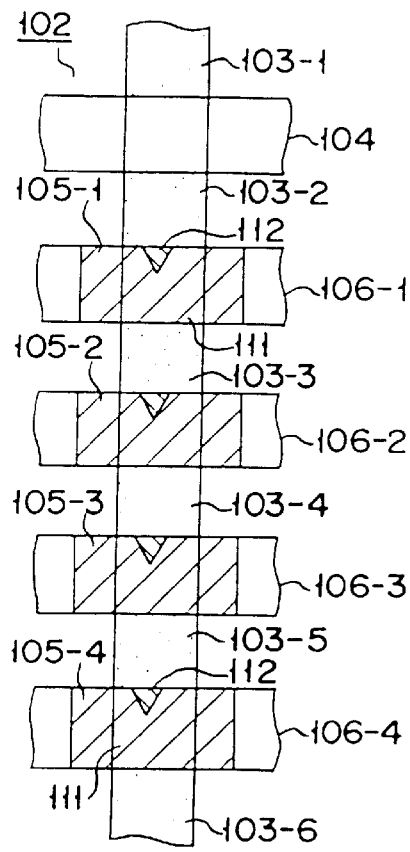
F I G. 26A
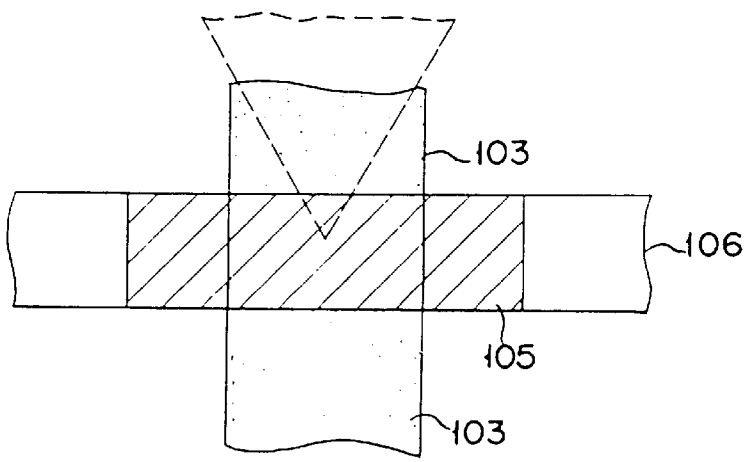
F I G. 26B

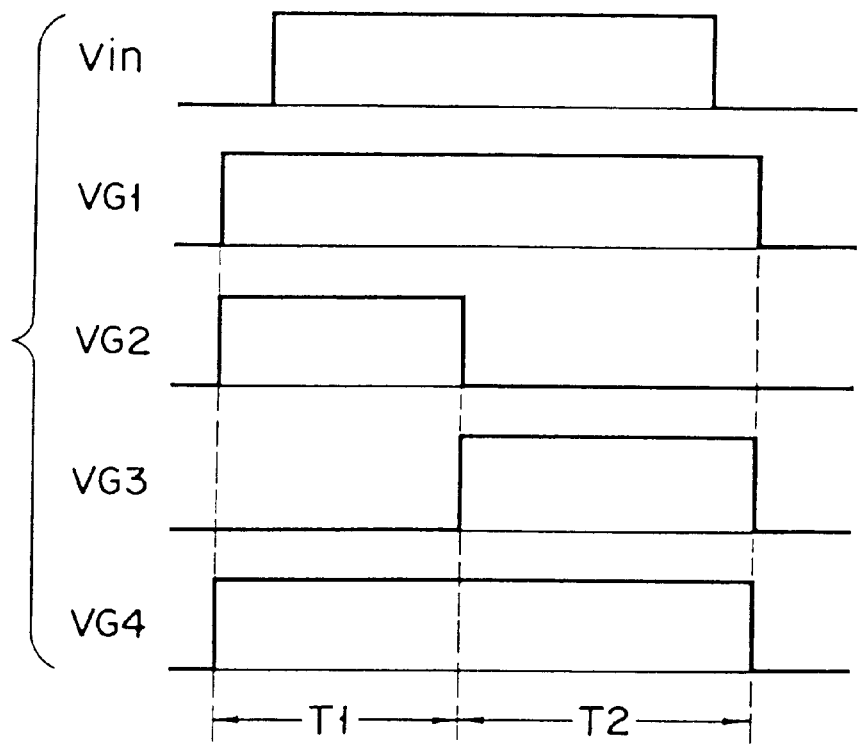
F I G. 29
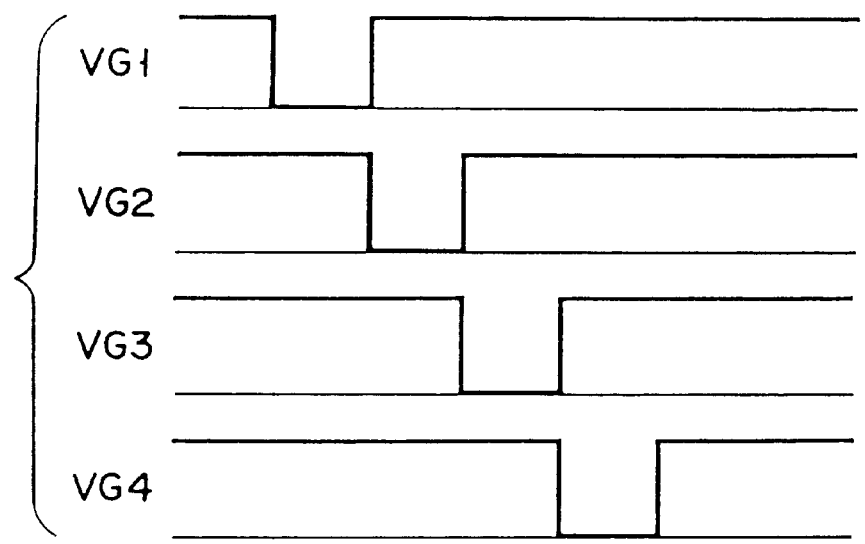
F I G. 30

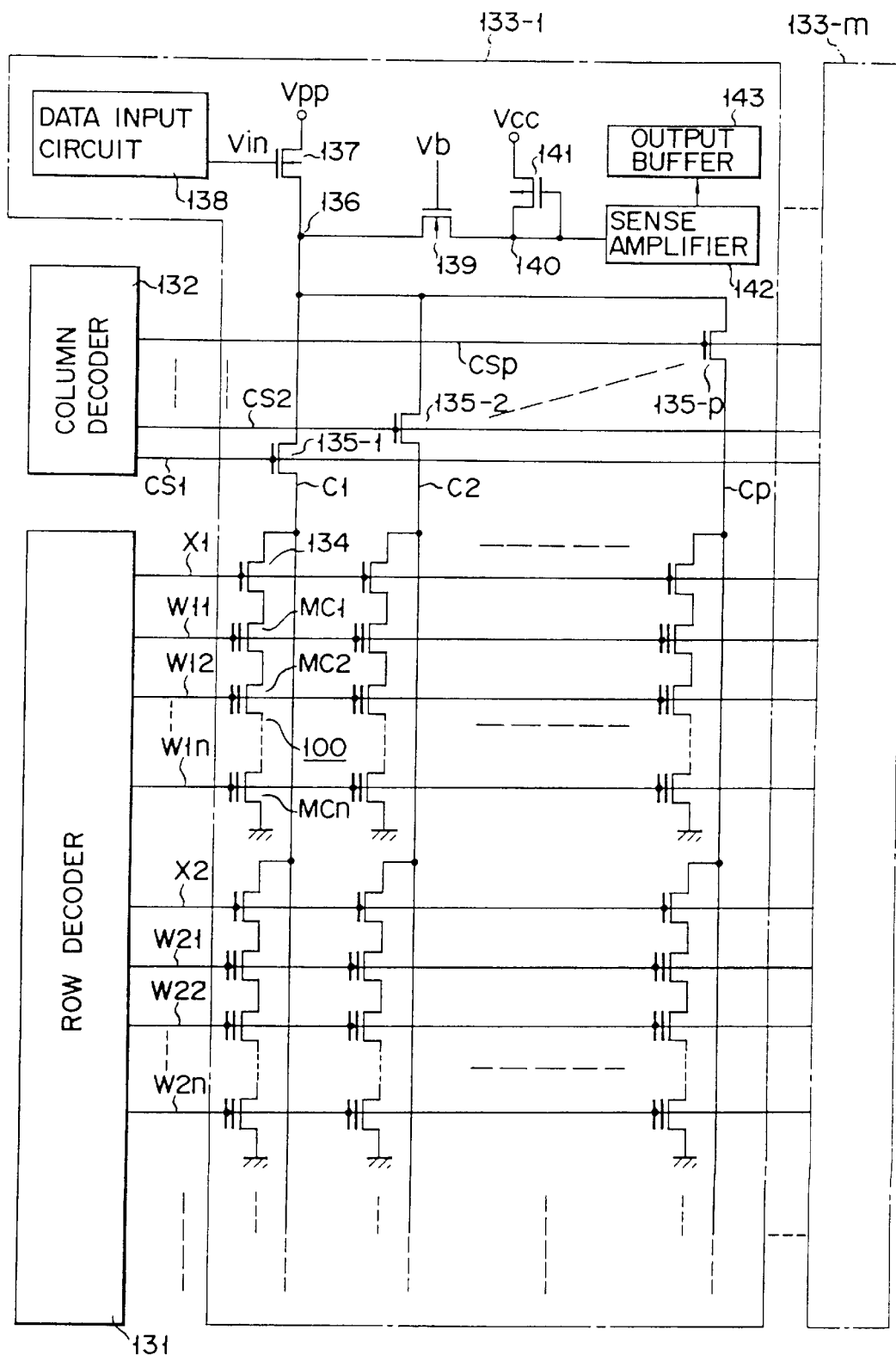
F I G. 31

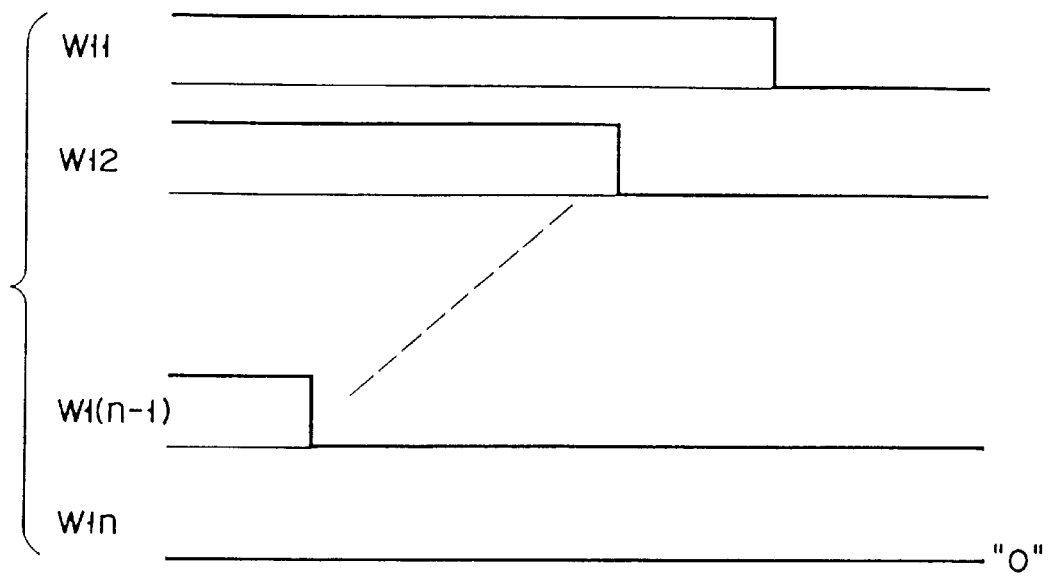
F I G. 33
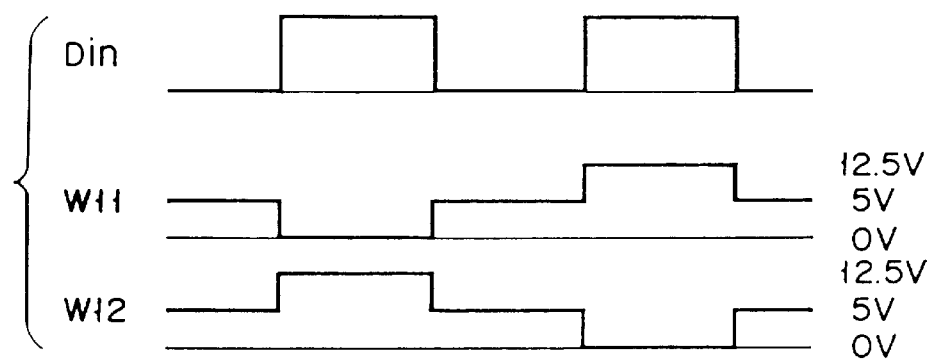
F I G. 34

| PR | A0 | A1 | A2 | A3 | W11 | W12 | W13 | W14 | W15 | W16 | W17 | W18 | W19 | W110 | W111 | W112 | W113 | W114 | W115 | W116 |
|---|---|---|---|---|---|---|---|---|---|---|---|---|---|---|---|---|---|---|---|---|
| — | ○ | ○ | ○ | ○ | ○ | ○ | ○ | ○ | ○ | ○ | ○ | ○ | ○ | ○ | ○ | ○ | ○ | ○ | ○ | ○ |
|  | — | ○ | ○ | ○ | — | ○ | ○ | ○ | ○ | ○ | ○ | ○ | ○ | ○ | ○ | ○ | ○ | ○ | ○ | ○ |
|  | ○ | — | ○ | ○ | — | — | ○ | ○ | ○ | ○ | ○ | ○ | ○ | ○ | ○ | ○ | ○ | ○ | ○ | ○ |
|  | — | — | ○ | ○ | — | — | — | ○ | ○ | ○ | ○ | ○ | ○ | ○ | ○ | ○ | ○ | ○ | ○ | ○ |
|  | ○ | ○ | — | ○ | — | — | — | — | ○ | ○ | ○ | ○ | ○ | ○ | ○ | ○ | ○ | ○ | ○ | ○ |
|  | — | ○ | — | ○ | — | — | — | — | — | ○ | ○ | ○ | ○ | ○ | ○ | ○ | ○ | ○ | ○ | ○ |
|  | ○ | — | — | ○ | — | — | — | — | — | — | ○ | ○ | ○ | ○ | ○ | ○ | ○ | ○ | ○ | ○ |
|  | — | — | — | ○ | — | — | — | — | — | — | — | ○ | ○ | ○ | ○ | ○ | ○ | ○ | ○ | ○ |
|  | ○ | ○ | ○ | — | — | — | — | — | — | — | — | — | ○ | ○ | ○ | ○ | ○ | ○ | ○ | ○ |
|  | — | ○ | ○ | — | — | — | — | — | — | — | — | — | — | ○ | ○ | ○ | ○ | ○ | ○ | ○ |
|  | ○ | — | ○ | — | — | — | — | — | — | — | — | — | — | — | ○ | ○ | ○ | ○ | ○ | ○ |
|  | — | — | ○ | — | — | — | — | — | — | — | — | — | — | — | — | ○ | ○ | ○ | ○ | ○ |
|  | ○ | ○ | — | — | — | — | — | — | — | — | — | — | — | — | — | — | ○ | ○ | ○ | ○ |
|  | — | ○ | — | — | — | — | — | — | — | — | — | — | — | — | — | — | — | ○ | ○ | ○ |
|  | ○ | — | — | — | — | — | — | — | — | — | — | — | — | — | — | — | — | — | ○ | ○ |
|  | — | — | — | — | — | — | — | — | — | — | — | — | — | — | — | — | — | — | — | ○ |

MEMORY CELL OF NON-VOLATILE SEMICONDUCTOR MEMORY DEVICE

This is a division of application Ser. No. 09/305,479, filed May 6, 1999, now U.S. Pat. No. 6,072,748, which is a continuation of application Ser. No. 08/901,660, filed Jul. 28, 1997, now U.S. Pat. No. 6,058,051 which is a division of application Ser. No. 08/731,914 filed Oct. 22, 1996, now U.S. Pat. No. 5,745,413, which is a division of application Ser. No. 08/433,071, filed May 3, 1995, now U.S. Pat. No. 5,596,525, which is a division of application Ser. No. 08/288,219, filed Aug. 9, 1994, now U.S. Pat. No. 5,448,517, which is a continuation of application Ser. No. 08/115,100, filed Sep. 2, 1993, now abandoned, which is a continuation of application Ser. No. 07/913,451, filed Jul. 15, 1992, now U.S. Pat. No. 5,270,969, which is a continuation of application Ser. No. 07/685,650, filed Apr. 16, 1991, now U.S. Pat. No. 5,148,394, which is a continuation of application Ser. No. 07/212,649, filed Jun. 28, 1988, now U.S. Pat. No. 5,008,856.—all incorporated herein by reference.

BACKGROUND OF THE INVENTION

1. Field of the Invention

This invention relates to a nonvolatile semiconductor memory device having floating gate type MOSFETs as memory cells.

2. Description of the Related Art

Conventionally, EEPROM and UVEPROM are known as the nonvolatile semiconductor memory device with a floating gate structure, for example. In the EEPROM, data is electrically written in or programmed and electrically erased. With a memory cell in the EEPROM, data can be programmed by injecting or emitting electrons into or from the floating gate via an oxide film with a thickness of approx. 100 Å which is extremely thinner than a gate oxide film by use of the tunnel effect. The EEPROM is explained in detail in U.S. Pat. No. 4,203,158 (Frohman-Bentchkowsky et al. "ELECTRICALLY PROGRAMMABLE AND ERASABLE MOS FLOATING GATE MEMORY DEVICE EMPLOYING TUNNELING AND METHOD OF FABRICATING SAME").

However, since, in the above EEPROM, two transistors are used to constitute a single memory cell, the memory cell size becomes large and the chip cost will increase.

For the above reason, ultraviolet erasable nonvolatile semiconductor memory devices or UVEPROM has an advantage in attaining high integration density, in which each memory cell is formed of a single transistor. In the UVEPROM, data can be electrically programmed and erased by applying ultraviolet rays thereto. As described above, in the UVEPROM, each memory cell is formed of a single transistor so that the chip size can be reduced for the same memory scale or capacity as that of the EEPROM.

However, in the UVEPROM, a high power source voltage is required to program data. That is, in order to inject electrons into the floating gate of a selected memory cell, a high voltage is applied between the control gate and drain to cause impact ionization in an area near the drain region, injecting the electrons thus generated into the floating gate. For this purpose, it becomes necessary to provide a power source of high voltage for data programming outside the memory device. In contrast, since electrons are injected into or emitted from the floating gate by the tunnel effect in the EEPROM, it is not necessary to use such a programming power source as is used in the UVEPROM and data can be programmed by an output voltage of a booster circuit provided in the same chip as that of the memory device. Therefore, the EEPROM can be operated on a single power source voltage of 5 V.

As described above, the UVEPROM can be formed at a higher integration density in comparison with the EEPROM. However, in general, since a single contact portion is formed for each common drain of two memory cell transistors, the number of contact portions increases. Increase in the number of contact portions is an obstruction to the attainment of high integration and large memory capacity. For this reason, the UVEPROM can be formed at a higher integration density than the EEPROM, but can be further improved in its integration density.

SUMMARY OF THE INVENTION

An object of this invention is to provide an EEPROM in which data can be electrically programmed, the memory cell size can be reduced and the cost can be lowered.

Another object of this invention is to provide a UVEPROM in which the number of contact portions can be reduced to further reduce the chip size and the high integration density and low cost can be attained.

According to one embodiment of this invention, there is provided a nonvolatile semiconductor memory device which comprises a selection transistor which is connected at one end to a column line and whose gate is connected to a row line; and a plurality of cell transistors which are connected in series between the other end of the selection transistor and a reference potential and whose control gates are connected to row lines, wherein electrons are emitted from a floating gate to a drain of the cell transistor or holes are injected from the drain to the floating gate in the data programming mode.

In a first embodiment of this invention, there is provided an EEPROM in which the selection transistor can be commonly used for the cell transistors so that the memory cell can be formed of substantially one cell transistor. Therefore, the size of the memory cell can be reduced, and the high integration density and low cost can be attained.

In a second embodiment of this invention, there is provided a UVEPROM in which a single contact portion can be commonly used for three or more cell transistors, thereby reducing the number of contact portions. Thus, the high integration density and low cost can be attained.

BRIEF DESCRIPTION OF THE DRAWINGS

FIG. 1 is a circuit diagram showing a nonvolatile semiconductor memory device according to a first embodiment of this invention;

FIGS. 2 and 3 are timing charts for illustrating the operation of the circuit shown in FIG. 1;

FIG. 4C is a cross sectional view taken along line 4C—4C of the pattern plan view of FIG. 4A;

FIG. 5A is a pattern plan view showing another construction of a cell transistor in the circuit of FIG. 1;

FIG. 5B is a cross sectional view taken along line 5B—5B of the pattern plan view of FIG. 5A;

FIG. 6A is a pattern plan view showing still another construction of a cell transistor in the circuit of FIG. 1;

FIG. 6B is a cross sectional view taken along line 6B—6B of the pattern plan view of FIG. 6A;

FIG. 9 is a circuit diagram showing still another construction of a data programming circuit constituted by two MOSFETs and a data input circuit in the circuit of FIG. 1;

FIG. 10 is a circuit diagram showing the construction of a memory device formed by arranging cell transistors shown in FIG. 1 in a matrix form;

FIGS. 11 and 12 are timing charts for illustrating operation of the circuit of FIG. 10;

FIGS. 13 and 14 are diagrams showing the levels of various signals in the circuit of FIG. 10;

FIG. 16 is a circuit diagram showing a modified construction of a memory cell section in the circuit of FIG. 1;

FIG. 17 is a circuit diagram showing a modified construction of a peripheral portion of the memory cell section in the circuit of FIG. 10;

FIG. 18A is a circuit diagram for illustration of another construction of the circuit of FIG. 10;

FIG. 18B is a circuit diagram showing a construction of a booster circuit in the circuit of FIG. 18A;

FIG. 19 is a circuit diagram for illustration of the principle of a nonvolatile semiconductor memory device according to a second embodiment of this invention;

FIG. 20 is a pattern plan view of the circuit of FIG. 19;

FIG. 21A is another pattern plan view of the circuit of FIG. 19;

FIG. 21B is a cross sectional view taken along line 21B—21B of the pattern plan view of FIG. 20A;

FIG. 22 is a pattern plan view indicating that the pattern structure of FIGS. 21A and 21B can be advantageously used in the manufacturing process;

FIGS. 23 to 25 and 26A are still other pattern plan views of the circuit of FIG. 19;

FIG. 26B is a pattern plan view illustrating an ion-implantation mask used for forming the pattern of FIG. 26A;

FIGS. 29 and 30 are timing charts for illustrating the operation of the circuit of FIG. 17;

FIG. 31 is a circuit diagram showing the construction of a nonvolatile semiconductor memory device formed of memory cells of the same construction as the memory cell shown in FIG. 19 and formed to have a plural-bit output construction;

FIGS. 32 to 34 are timing charts for illustrating the operation of the memory device of FIG. 31;

FIGS. 38 and 39 are the truth tables obtained in the row decoder of the memory device of FIG. 31.

DETAILED DESCRIPTION OF THE PREFERRED EMBODIMENTS

FIG. 1 shows a memory cell section and a peripheral circuit section (programming circuit and readout circuit) thereof in an EEPROM according to a first embodiment of this invention. The FIG. 1 circuit is schematically shown for briefly explaining the first embodiment of this invention. Data programming circuit 10 is constituted by input circuit 11 and N-channel MOSFETs 12 and 13. Output signal D1 from data input circuit 11 is supplied to the gate of MOSFET 12 which is connected at one end to high voltage power source Vpp. Output signal D2 of data input circuit 11 is supplied to the gate of MOSFET 13 connected between node N1 on the other end of MOSFET 12 and a ground terminal (reference potential terminal). MOSFET 12 is used to charge node N1 in the programming mode and MOSFET 13 is used to discharge node N1. The current paths of selection transistor ST and cell transistors CT1 to CT4 are serially connected between node N1 and the ground terminal. The gate of selection transistor ST is applied a signal X1 for selecting a group of cell transistors CT1 to CT4. Further, the gates of cell transistors CT1 to CT4 are respectively applied signals W1 to W4 for respectively selecting cell transistors CT1 to CT4. Node N1 is further connected to one end of N-channel MOSFET 14 whose condcution state is controlled by signal RE set at "1" level in the readout mode and at "0" level in the programming mode. The other end of MOSFET 14 is connected to an input terminal of data detection circuit 15. P-channel MOSFET 16 is connected between power source terminal Vcc and node N2 which is present on the input side of data detection circuit 15 and the gate thereof is connected to node N2. MOSFET 16 functions as a load in the readout mode.

For brief explanation, a combination of selection transistor ST and cell transistors CT1 to CT4 is referred to as a single memory cell in the first embodiment. However, it should be understood that the memory cell is different from an ordinary memory cell and can store data of four bits (the number of bits corresponds to that of cell transistors having current paths connected in series). That is, the memory cell in this example is equivalent to four conventional memory cells.

Figure 3:
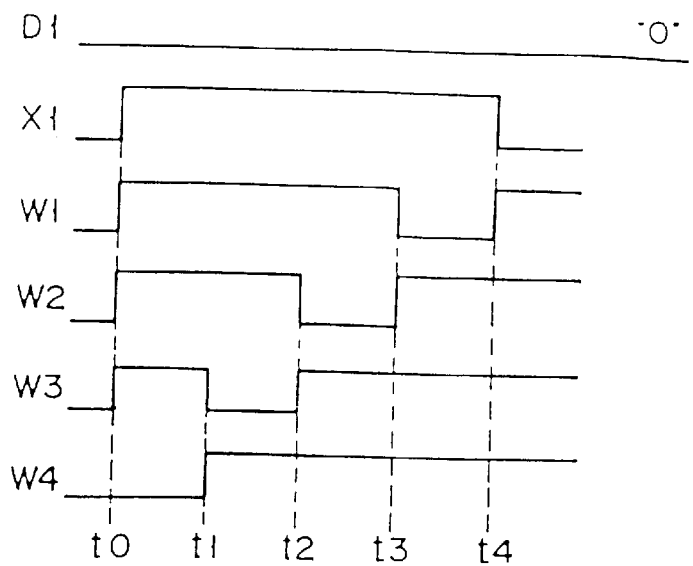

There will now be described an operation of the memory device with the above construction with reference to FIGS. 2 and 3. FIG. 2 is a timing chart of various signals in the programming mode in the circuit of FIG. 1. First, signal RE is set to "0" level to turn off transistor 14. At time t0, signals X1 and W1 to W4 are set to a high voltage level to inject electrons into the floating gates of cell transistors CT1 to CT4. Then, at successive times t1 to t4, signals W4 to W1 are sequentially set to 0 V in this order. If output signals D1 and D2 of data input circuit 11 are respectively set at "1" and "0" levels when signals W1 to W4 are set to 0 V, transistors 12 and 13 are respectively turned on and off, causing a high voltage from high voltage power source Vpp to be applied to the drain of a corresponding transistor via transistor 12 and selection transistor ST so that electrons can be emitted from the floating gate of the respective cell transistors. In FIG. 2, since signal D1 is set at "1" when signals W3 and W1 are set to 0 V, electrons are emitted from the floating gates of cell transistors CT3 and CT1. Thus, data can be programmed. In a case where output signals D1 and D2 of data input circuit 11 are set at "0" and "1" levels, respectively, node N1 is discharged.

In the data readout mode, output signals D1 and D2 of data input circuit 11 are set to "0" level to turn off transistors 12 and 13. Further, signals RE and X1 are set to "1" level and the control gate voltage of a cell transistor to be selected for data readout is set to 0 V. At this time, the control gate voltages of other cell transistors are set to "1" level. FIG. 3 is a timing chart showing the case where data is sequentially read out from cell transistors CT4 to CT1. More specifically, data is read out from cell transistor CT4 in a period of time t0 to t1, from cell transistor CT3 in a period of time t1 to t2, from cell transistor CT2 in a period of time t2 to t3, and from cell transistor CT1 in a period of time t3 to t4. Assume now that signal W1 is set at 0 V and signals W2 to W4 are set at "1" level. Then, data is read out from cell transistor CT1. If data has been programmed as described before, the threshold voltage thereof is set negative since electrons have been emitted from the floating gate of cell transistor CT1, and therefore cell transistor CT1 is turned on by signal W1 of 0 V. The control gate voltages of other cell transistors CT2 to CT4 are set at "1" level and the cell transistors are turned on. Thus, all the cell transistors are set in the conductive state, lowering the potential of node N2. The potential fall is detected by means of data detection circuit 15 and thus data can be read out from cell transistor CT1. Assume now that signal W2 is set to 0 V to select cell transistor CT2 and electrons are kept held in the floating gate of cell transistor CT2. Since, in this case, the control gate voltage is set at 0 V, cell transistor CT2 is turned off. Therefore, node N2 is charged via transistor 16, and the potential rise of node N2 is detected by means of data detection circuit 15. It should be noted here that the threshold voltages of cell transistors CT1 to CT4 having electrons kept held in the floating gates are so determined that the cell transistors can be turned on when the control gate voltages thereof are set to "1" level.

Figure 4A:
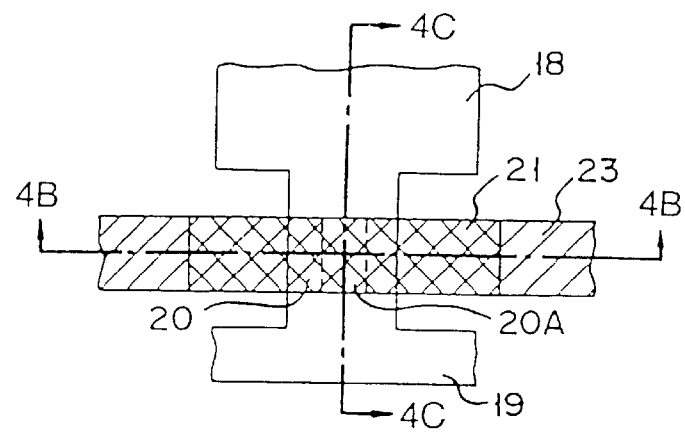
FIG. 4A is a pattern plan view showing the construction of a cell transistor in the circuit of FIG. 1.
Figure 4B:
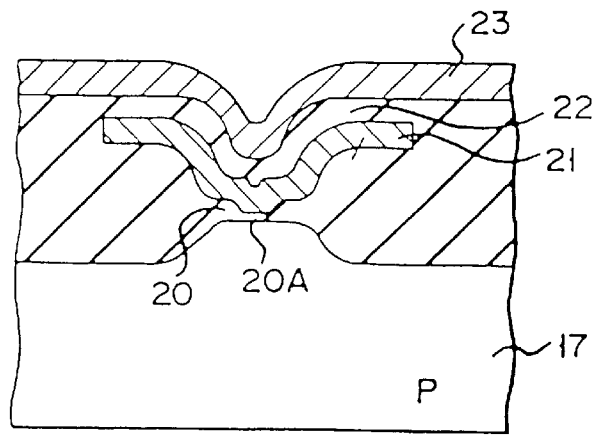
FIG. 4B is a cross sectional view taken along line 4B—4B of the pattern plan view of FIG. 4A.

FIGS. 4A to 4C show an example of a transistor which is suitable for cell transistors CT1 to CT4 and in which part of the insulation film on the channel region is formed of a thin oxide film with the thickness of approx. 100 Å. FIG. 4A is a pattern plan view, FIG. 4B is a cross sectional view taken along line 4B—4B of FIG. 4A, and FIG. 4C is a cross sectional view taken along line 4C—4C of FIG. 4A. $N^+$-type source and drain regions (18 and 19) are formed with a predetermined distance therebetween in the main surface area of P-type silicon substrate 17. First oxide film 20 having thin portion 20A is formed on that part of semiconductor substrate 17 which lies on the channel region between source and drain regions (18 and 19). Floating gate 21 is formed on oxide film 20, and control gate 23 is formed on second oxide film 22 formed on floating gate 21.

FIGS. 5A and 5B show another example of a transistor suitable for cell transistors CT1 to CT4 in the circuit of FIG. 1. In this case, an insulation layer disposed on the entire portion of the channel region is formed of an oxide film with a thickness of approx. 100 Å. Portions in FIGS. 5A and 5B which are similar to those in FIGS. 4A to 4C are denoted by the same reference numerals. FIG. 5A is a pattern plan view and FIG. 5B is a cross sectional view taken along line of 5B—5B of FIG. 5A.

FIGS. 6A and 6B show still another example of a transistor suitable for cell transistors CT1 to CT4 in the circuit of FIG. 1. In the cell transistor shown in FIGS. 6A and 6B, $N^-$-type impurity region 24 with low impurity concentration is formed in part of the channel region. That is, the cell transistor is a depletion type transistor. FIG. 6A is a pattern plan view and FIG. 6B is a cross sectional view taken along line of 6B—6B of FIG. 6A. With this construction, even if electrons are injected into the floating gate to such an extent that the cell transistor may be kept off when a "1" level signal is supplied to the control gate, current will flow since source and drain regions 18 and 19 are connected to each other via $N^-$-type impurity region 24. The operation of reading out data from the cell transistor with above construction is effected by detecting the amount of current varying according to whether or not electrons are injected into the floating gate when a "0" level voltage is applied to the control gate.

Figure 7:
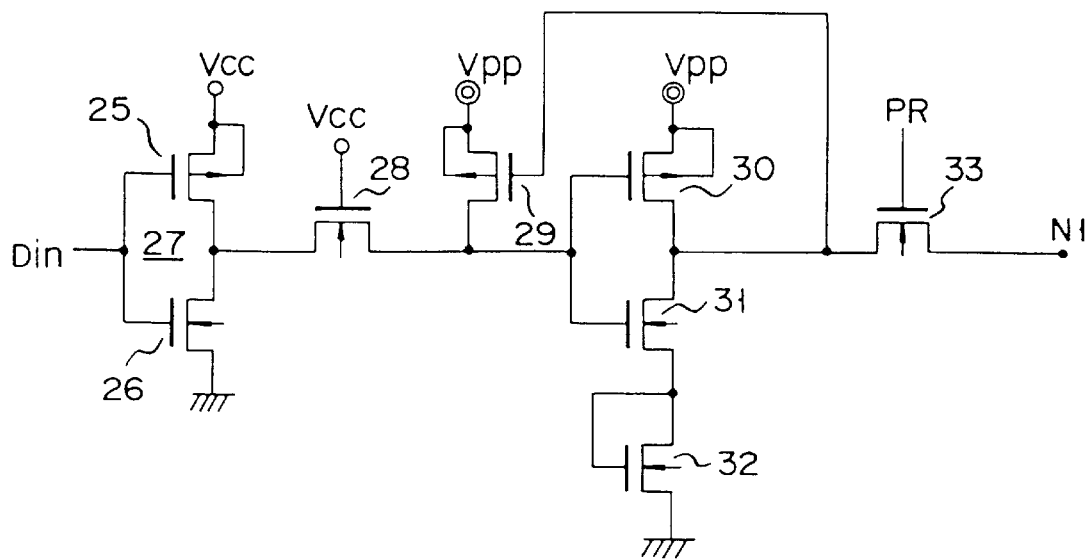
FIG. 7 is a circuit diagram showing another construction of a data programming circuit constituted by two MOSFETs and a data input circuit in the circuit of FIG. 1.

FIG. 7 shows another construction of data programming circuit 10 constituted by MOSFETs 12 and 13 and data input circuit 11 in the circuit of FIG. 1. Programming data Din is supplied to CMOS inverter 27 formed of P-channel MOSFET 25 and N-channel MOSFET 26. The output terminal of CMOS inverter 27 is connected to one end of N-channel MOSFET 28 whose gate is connected to power source Vcc. P-channel MOSFET 29 is connected between the other end of MOSFET 28 and power source Vpp of high voltage, for example, 12.5 V. Further, the other end of MOSFET 28 is connected to the gates of P-channel MOSFET 30 and N-channel MOSFET 31. One end of MOSFET 30 is connected to power source Vpp, and the other end thereof is connected to one end of MOSFET 31. N-channel MOSFET 32 is connected between the other end of MOSFET 31 and the ground terminal. The gate of MOSFET 32 is connected to the other end of MOSFET 31. A connection node between MOSFETs 30 and 31 is connected to the gate of MOSFET 29 and one end of N-channel MOSFET 33. The gate of MOSFET 33 is supplied with signal PR which is set at an "1" level in the program mode and an "0" level in the readout mode. In this case, "1" level indicates a high voltage level approximately equal to Vpp level. If signal PR is set higher than Vpp by the threshold voltage of MOSFET 33, voltage of Vpp is transmitted as it is to mode N1. The other end of MOSFET 33 is connected to node N1 or one end of selection transistor ST and one end of transistor 14 in the circuit of FIG. 1.

With the above construction, signal PR is set at "1" level in the data programming mode to turn on MOSFET 33. In this case, high voltage Vpp is generated from data programming circuit 10 when input data Din is at "1" level, and a signal of a level equal to threshold voltage $V_{TH}$ of MOSFET 32 is generated as programming data when input data Din is at "0" level. In this example, a signal of $V_{TH}$ level is generated when input data Din is at "0" level. The reason why a $V_{TH}$ level signal is output when input data Din is at "0" level is as follows:

As will be described later, a plurality of memory cells as shown in FIG. 1 are arranged in a matrix form in order to from an integrated circuit. Therefore, adjacent transistors ST are controlled by the same signal X1, and the gates of transistors ST are formed of the same polysilicon layer, for example. Signal X1 is set at a high voltage level in the programming mode, and at this time, potentials of the drains of transistors ST are set at different levels according to the programming data. For example, in a case where electrons are emitted from the floating gate of a cell transistor connected to a first one of transistors ST and electrons are injected into the floating gate of a cell transistor connected to the other or second transistor ST, the drain of the first transistor ST is set at a high potential and the drain of the second transistor ST is set at a low potential. In this case, a parasitic MOS transistor is formed between the first and second transistors ST connected to the same polysilicon layer. If the parasitic MOS transistor has a threshold voltage lower than the potential level of signal X1, unwanted current will flow from the first transistor ST whose drain is set at a high potential to the second transistor ST through the parasitic MOS transistor. The drain potential of the first transistor ST is lowered by the unwanted current flow, deteriorating the programming characteristics. In order to prevent the deterioration of the programming characteristics, the amount of impurity implanted into the field area for channel-cut may be increased to get a high threshold voltage of the parasitic MOS transistor. However, if the impurity concentration of the field area is increased, the breakdown voltage in the drain region to which a high voltage is applied will be lowered. As shown in FIG. 7, if the drain of transistor ST which is set at a low potential to inject electrons into the floating gate is connected to the ground terminal through MOSFET 32, the above-described problem will not occur. When current flows through the parasitic MOS transistor, the drain of the second transistor ST is charged and the drain voltage is increased, thus increasing the source potential of the parasitic MOS transistor. The source potential increase of the parasitic MOS transistor being on the increase of the threshold voltage without increasing the amount of impurity implanted into the field area for channel-cut. Therefore, no current will flow from the first transistor ST to the second transistor ST through the parasitic MOS transistor and the drain voltage of the first transistor ST can be enhanced to a sufficiently high voltage level, effectively preventing the deterioration of the programming characteristics. In the data readout mode, since signal PR is set at "0" level to turn off MOSFET 33, data programming circuit 10 has no influence on the potential at node N1.

Figure 8:
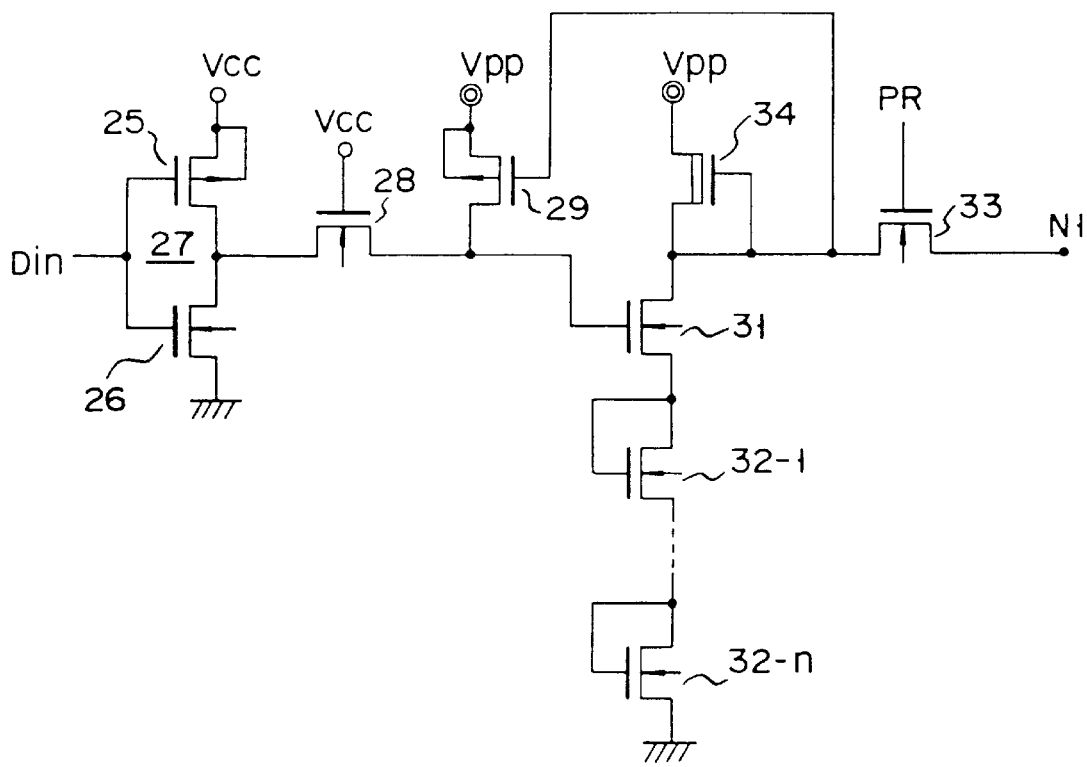
FIG. 8 is a circuit diagram showing still another construction of a data programming circuit constituted by two MOSFETs and a data input circuit in the circuit of FIG. 1.

FIG. 8 shows still another construction of data programming circuit 10 in the circuit of FIG. 1. In the circuit, depletion type MOSFET 34 is used as a load instead of P-channel MOSFET 30 in FIG. 7. Further, in the circuit, a plurality of diode connected MOSFETs 32-1 to 32-n are provided. The number of MOSFETs 32-1 to 32-n is determined by a designed output level. With this construction, substantially the same operation as that of the FIG. 7 can be attained.

As described above, in order to prevent current from flowing through the parasitic MOS transistor, it is preferable to set higher the potential of an area acting as the source of the parasitic MOS transistor into which the current flows. When the source potential is set higher, we get a higher threshold voltage of the parasitic MOS transistor. For this reason, as shown in FIG. 8, a plurality of MOSFETs 32-1 to 32-n are used. However, in this case, if the source potential is set to be extremely high, electrons may happen to be emitted from the drain to the floating gate of the cell transistor. Therefore, it is necessary to set the source potential in such a potential level that electrons will not emitted from the drain of the cell transistor and current will not flow out from the parasitic MOS transistor.

FIG. 9 shows still another construction of data programming circuit 10 in the circuit of FIG. 1. Inverted signal $\overline{Din}$ of data Din is supplied to the gates of P-channel MOSFET 35 and N-channel MOSFET 36. P-channel MOSFET 37 is connected between one end of MOSFET 35 and power source Vcc. The gate of MOSFET 37 is supplied with signal $\overline{PR}$ which is set at "L" level in the program mode. The other end of MOSFET 35 is connected to one end of MOSFET 36 which is connected at the other end to the ground terminal. N-channel MOSFET 38 having a gate supplied with signal $\overline{PR}$ is connected between the ground terminal and a connection node between MOSFETs 35 and 36. Further, one end of N-channel MOSFET 39 whose gate is connected to power source Vcc is connected to a connection node between MOSFETs 35 and 36. P-channel MOSFET 40 is connected between the other end of MOSFET 39 and power source Vpp. The other end of MOSFET 39 is connected to the gates of P-channel MOSFET 41 and N-channel MOSFET 42. One end of MOSFET 41 is connected to power source Vpp and the other end thereof is connected to one end of MOSFET 42 which is connected at the other end to the ground terminal. The gates of MOSFET 40 and P-channel MOSFET 43 are connected to a connection node between MOSFETs 41 and 42. One end of MOSFET 43 is connected to power source Vpp and the other end thereof is connected to one end of N-channel MOSFET 44. Diode connected N-channel MOSFET 45 is connected between the other end of MOSFET 44 and the ground terminal.

Data $\overline{Din}$ is supplied to an input terminal of CMOS inverter 48 including P-channel MOSFET 46 and N-channel MOSFET 47. An output signal of CMOS inverter 48 is supplied to the gates of P-channel MOSFET 49 and N-channel MOSFET 50. P-channel MOSFET 51 is connected between one end of MOSFET 49 and power source Vcc, and the gate of MOSFET 51 is supplied with signal $\overline{PR}$. The other end of MOSFET 49 is connected to one end of MOSFET 50 which is connected at the other end to the ground terminal. N-channel MOSFET 52 having a gate supplied with signal $\overline{PR}$ which is set at "L" level in the programming mode is connected between the ground terminal and a connection node between MOSFETs 49 and 50. The gate of MOSFET 44 is connected to a connection node between MOSFETs 49 and 50, and the connection node between MOSFETs 43 and 44 is connected to node N1.

With this construction, the same operation as that of the circuit shown in FIGS. 7 and 8 can be attained. That is, since signal $\overline{PR}$ is set at "H" level at a time other than the programming mode, for example, in the readout mode, MOSFETs 38 and 52 are turned on and MOSFETs 37 and 51 are turned off. Therefore, MOSFETs 43 and 44 are turned off, electrically isolating data programming circuit 10 from node N1. In contrast, signal $\overline{PR}$ is set at "0" level in the data programming mode so that MOSFETs 37 and 51 will be turned on and MOSFETs 38 and 52 will be turned off. Therefore, high voltage Vpp is generated from data programming circuit 10 when input data $\overline{Din}$ is at "0" level, and a signal at a level equal to the threshold voltage $V_{TH}$ of MOSFET 45 when input data Din is at "1" level.

FIG. 10 shows a nonvolatile semiconductor memory device formed by arranging memory cells with the above construction in a matrix form. In FIG. 10, data programming and reading circuits 200 surrounded by one-dot-dash lines in the circuit of FIG. 1 are connected to data input/output lines IO1 to IO8. In FIG. 10, a plurality of data programming and reading circuits 200 are formed by a single block. Row decoder 53 generates signals X1, X2, . . . , signals W11, W12, . . . , W1n, and signals W21, W22, . . . , W2n to select a row line or lines in the memory cell array. Column decoder 54 generates signals Y1 to Ym to selectively activate column selection MOSFETs Q1 to Qm so that data to be programmed can be supplied to one of memory cell blocks B1 to Bm through data input/output lines IO1 to IO8 or data can be read out from one of the memory cell blocks through the input/output lines. Further, column decoder 55 generates signals Z2 to Zm to selectively activate depletion type MOSFETs QD2 to QDm for array division so as to sequentially specify memory cell blocks B1 to Bm in the program mode.

With the above construction, the data programming operation is effected starting from the memory cell which is positioned far away from row decoder 53. Now, the data programming operation in the memory device of FIG. 10 is explained. FIG. 11 is a timing chart of various signals in the program mode. That is, the data programming operation is effected with respect to the memory cells connected to data line X1 of memory cell block Bm. At the time of programming, signals X1, Ym, Z2 to Zm are set at a high voltage level. In this condition, signals W11 to W1n are set to a high voltage level to inject electrons into the floating gates of the cell transistors. Then, signals W1n to W11 are sequentially set to "0" level in this order. In this case, electrons are emitted only when the control gate voltage is at "0" level and programming data is supplied as a high voltage to the drain through any one of data input/output lines IO1 to IO8, column selection transistor Qm and selection transistor STm, and thus data can be programmed in the respective cell transistors.

FIG. 12 is a timing chart for the readout mode, and signals X and Y associated with a selected memory cell are set at "1" level. Further, one of signals W11 to W1n associated with cell transistors of the selected memory cell is set to "0" level, and all the gate voltages of nonselected cell transistors are set at "1" level. As a result, data can be read out in the same manner as in the case of the circuit of FIG. 1.

FIG. 13 shows the truth table indicating the levels of signals W11 to W1n. For simplifying the explanation, assume that n is set to 4, and the cell transistor is selected by tow address signals A0 and A1. In this case, signal RE is used to identify the programming mode and readout mode. That is, signal RE indicates the programming mode when set at "0", and the readout mode when set at "1".

Signal I is a signal used for initialization. If signal I is set at "1" when signal RE is set at "0" indicating the programming mode, W11 to W14 are set at "1" level or a high voltage level irrespective of signals A0 and A1, causing electrons to be injected into the floating gates of the cell transistors connected to W11 to W14. When signals I and RE are at "0" level, the potential levels of W11 to W14 are determined according to address signals A0 and A1 as shown in the truth table.

When signal RE is at "1" level indicating the readout mode, the potential levels of W11 to W14 are determined according to address signals A0 and A1 irrespective of signal I. That is, in the readout mode, only one of W11 to W14 selected by a combination of address signals A0 and A1 is set to "0" level.

"1" level at which W11 to W14 are set in the programming mode is set at a high voltage of, for example, approx. 20 V, and "1" level at which W11 to W14 are set in the readout mode is set to a low voltage of, for example, 5 V.

FIG. 14 shows the truth table of signals X1, X2, W11 to W14, and W21 to W24 in the readout mode in combination with three addresses A0 to A2. In this example, if X1="0", signals W11 to W14 are set at "0" level in the readout mode, but it is also possible to set one of signals W11 to W14 to "0" in the same manner as in the case of X1="1".

Figure 15:
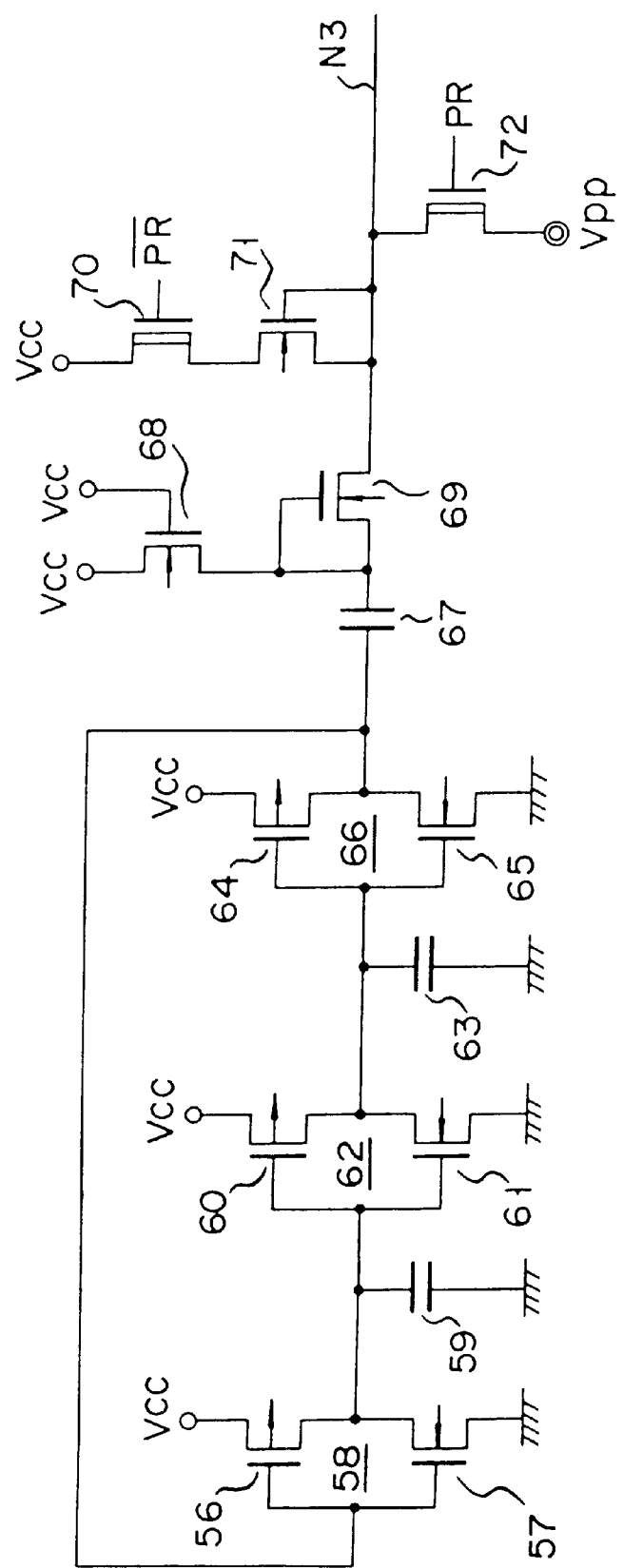
FIG. 15 is a circuit diagram showing the construction of a circuit for applying a power source voltage of two different voltage levels to the row decoder in the circuit of FIG. 10.

FIG. 15 shows a circuit for selectively producing power source voltage Vcc which set a potential used in the reading mode and high level voltage Vpp of 20 V, for example, which is used for programming mode to row decoder 53 in the circuit of FIG. 10. In the circuit of FIG. 15, capacitor 59 is connected between the ground terminal and an output terminal of CMOS inverter 58 including P-channel MOSFET 56 and N-channel MOSFET 57. The output terminal of CMOS inverter 58 is connected to an input terminal of CMOS inverter 62 including P-channel MOSFET 60 and N-channel MOSFET 61. Capacitor 63 is connected between the ground terminal and the output terminal of CMOS inverter 62. The output terminal of CMOS inverter 62 is connected to an input terminal of CMOS inverter 66 including P-channel MOSFET 64 and N-channel MOSFET 65. The output terminal of CMOS inverter 66 is connected to the input terminal of CMOS inverter 58 and one electrode of capacitor 67. N-channel MOSFET 68 having a gate connected to power source Vcc is connected between the other electrode of capacitor 67 and the power source Vcc. Further, the other electrode of capacitor 67 is connected to one end and the gate of N-channel MOSFET 69. The current paths of depletion type (D-type) MOSFET 70 and N-channel MOSFET 71 are serially connected between the other end of MOSFET 69 and power source Vcc. The gate of MOSFET 70 is connected to receive signal $\overline{PR}$ and the gate of MOSFET 71 is connected to the other end of MOSFET 69. D-type MOSFET 72 having a gate connected to receive signal PR is connected between the other end of MOSFET 69 and high level voltage source Vpp. Node N3 used as an output terminal of the circuit of FIG. 15 is connected to a power source terminal of row decoder 53 in the circuit of FIG. 10.

With the construction described above, when signal PR is set at "0" level and signal $\overline{PR}$ is set at "1" level, or when data is read out from a cell transistor, MOSFETs 70 and 72 are turned on and off, respectively, CMOS inverters 58, 62 and 66 are connected to constitute a ring oscillator whose oscillation output is supplied to one electrode of capacitor 67. Power source voltage Vcc is stepped up by means of MOSFETs 68, 69 and 71, and is transmitted to node N3. The other end of MOSFET 69 is set at a potential higher than power source voltage Vcc by the threshold voltage of MOSFET 71. In contrast, when signal PR is set at "1" level and signal $\overline{PR}$ is set at "0" level, that is, when data is programmed in a cell transistor, MOSFETs 72 and 70 are turned on and off, respectively. Therefore, in this case, power source voltage Vpp is supplied to node N3 through MOSFET 72.

Thus, in the circuit of FIG. 15, a first readout voltage higher than power source voltage Vcc is supplied when data is read out from a cell transistor, and power source Vpp higher than the first readout voltage is supplied in the programming mode. In this way, row decoder 53 is operated on power source voltages of different voltage levels in the data programming mode and readout mode.

It is of source possible to supply power source voltage Vcc itself as the power source voltage for row decoder 53 in the data readout mode. In the readout mode, the gate of the selected cell transistor is set to "0" and the gate of the nonselected cell transistor is set to "1". Data is determined depending on whether or not current flows in the selected cell transistor whose gate is set at "0". As the current flowing in the selected cell transistor becomes larger, data input/output line IO may be charged or discharged at a higher speed, thus enhancing the data readout speed.

Since the memory cell is constituted by connecting cell transistors in series, the same amount of current as that which flows in the selected cell transistor flows in the nonselected cell transistor. Therefore, current flowing in the memory cell is determined by a series circuit of the resistive component of the selected cell transistor and the resistive component of the nonselected cell transistor. For this reason, the current flowing in the memory cell becomes larger as the resistive component of the nonselected cell transistor is reduced. Therefore, in the circuit of FIG. 15, a voltage which is higher than power source voltage Vcc by the threshold voltage of MOSFET 71 is used as the power source voltage for row decoder 53 so as to set the gate voltage of the nonselected cell transistor higher, thus reducing the resistance of the nonselected cell transistor. In a case where row decoder 53 is constituted by CMOS circuits, current which may constantly flow in the circuit can be suppressed to 0. Therefore, the circuit of FIG. 15 can be satisfactorily used as a power source. Further, power source voltage Vpp can be supplied from the exterior. However, if the peripheral circuit is formed of CMOS circuits, constantly flowing current can be prevented, and therefore Vpp can be internally obtained by stepping up power source voltage Vcc by use of a charge pump circuit in the well known manner.

FIG. 16 shows another construction of the memory cell section in FIG. 1. In the circuit of FIG. 16, N-channel MOSFET 80 whose conduction state is controlled by signal $\overline{PR}$ set at "0" or "1" level respectively in the programming mode or readout mode is connected between cell transistor CT4 of FIG. 1 and the ground terminal. Portions in FIG. 16 which are similar to those in FIG. 1 are denoted by the same reference numerals and the detail explanation thereof is omitted.

With this construction, even if a leakage current flows from cell transistors CT1 to CT4 when a high voltage is applied to the drain thereof in the program mode, the leakage current can be cut off by means of transistor 80. Thus, the drain potential can be prevented from being lowered and the programming characteristic can be prevented from being deteriorated. In the circuit of FIG. 10, transistor 80 can be used commonly for a plurality of cell blocks.

FIG. 17 shows a circuit which can be used to form the FIG. 1 circuit in a matrix form. The circuit of FIG. 17 corresponds to one of memory cell blocks B1 to Bm, and includes MOSFETs QT1, QT2, . . . which are connected to the control gates of the cell transistors and whose conduction states are controlled by signals X1, X2, . . . Since signals are input through MOSFETs QT1, QT2, . . . a desired one of the memory cell blocks can be programmed by selectively satisfying a logical condition determined by a combination of signals W11, W12, . . . and signals Z2 to Zm supplied to corresponding memory cell blocks to selectively set signals W1n1, . . . W121, W111 to a high voltage level. In this case, two-layered aluminum wiring layer is used and signals W111, W121, . . . , W1n1 are transmitted via the second wiring aluminum layer. Therefore, the chip size will be increased because the wiring layer for signals W111, W121, . . . , W1n1 is additionally provided, but increase in the chip size can be suppressed to a minimum.

Further, it is possible to connect a latch circuit shown in FIG. 18 to each column line (the drain of selection transistor ST). In this case, one end of MOSFET 81 and input and output terminals of booster circuit 82 are connected to each column line. The gate of MOSFET 81 is connected to receive signal LA/PR which is set at "1" level in the latching operation and programming mode, and set at "0" level in the read mode. The other end of MOSFET 81 is connected to an output terminal of CMOS inverter 85 constituted by P-channel MOSFET 83 and N-channel MOSFET 84 and an input terminal of CMOS inverter 88 constituted by P-channel MOSFET 86 and N-channel MOSFET 87. The input terminal of CMOS inverter 85 is connected to the output terminal of CMOS inverter 88. Thus, CMOS inverters 85 and 88 are connected to constitute latch circuit 89. Data to be programmed can be latched in latch circuit 89, and the column lines can be selectively set at high voltage of 0 V according to the latched data for one row of memory cells so that the all memory cells connected to one line of row lines can be programmed. Therefore, MOSFETs QD2 to QDm for array division shown in FIG. 10 can be omitted.

FIG. 18B shows the construction of booster circuit 82 in the circuit of FIG. 18A. Clock generating circuit 90 generates clock signal $\phi C$. The output terminal of clock generating circuit 90 is connected to one electrode of MOS capacitor 92 which is connected at the other electrode to one end of MOSFET 93 having a threshold of approx. 0 V and one end and the gate of MOSFET 94. The other end of MOSFET 93 is connected to receive an output voltage Vpp' of another booster circuit (not shown) and the gate thereof is connected to the column line. The other output terminal of MOSFET 94 is connected to the column line.

In booster circuit 82, when the latch data is "1", the potential of the column line is stepped up and supplied to the cell transistor.

According to the first embodiment described above, a nonvolatile semiconductor memory device is provided in which data can be electrically programmed, the memory cell size can be made smaller than a UVEPROM, and the low cost can be attained.

FIG. 19 is a circuit diagram for illustrating the principle of a nonvolatile semiconductor memory device according to a second embodiment of this invention. That is, the nonvolatile semiconductor memory device is constructed by applying this invention to a UVEPROM. Each of cell transistors MC1 to MC4 is constituted by a floating gate type MOSFET having floating and control gates. The current paths of four cell transistors MC are serially connected to constitute series circuit 100. One end of series circuit 100, or the drain of cell transistor MC1 is connected to programming voltage source Vpp of high voltage, for example, 20 V through enhancement type (E-type) MOSFET 101 for application of programming voltage. The other end of series circuit 100 or the source of cell transistor MC4 is connected to the reference voltage terminal (ground terminal) of 0 V. The gate of MOSFET 101 is connected to receive voltage Vin corresponding to programming data Din, and the control gates of four cell transistors MC1 to MC4 are connected to receive selection voltages VG1 to VG4, respectively.

FIG. 20 is a pattern plan view of the circuit of FIG. 19 which is integrated on a semiconductor wafer. The pattern is formed in and on semiconductor substrate 102. Diffusion regions 103-1 to 103-6 are formed in the main surface area of semiconductor substrate 102 to constitute the source and drain regions of MOSFET 101 and four cell transistors MC1 to MC4. MOSFET 101 has gate 104 formed on a first insulation layer (not shown) formed on that part of semiconductor substrate 102 which lies between diffusion regions 103-1 and 103-2. Further, floating gates 105-1 to 105-4 of cell transistors MC1 to MC4 are formed on the first insulation layer and over those portions of semiconductor substrate 102 which lie between diffusion regions 103-2 and 103-3; 103-3 and 103-4; 103-4 and 103-5; and 103-5 and 103-6. Control gates 106-1 to 106-4 of cell transistors MC1 to MC4 are formed on a second insulation layer (not shown) and over floating gates 105-1 to 105-4.

With the memory cell of this construction, one end of series circuit 100 or a connection node between cell transistor MC1 and programming voltage applying MOSFET 101 is connected to column line (not shown) via a contact portion. Therefore, in the FIG. 19 circuit, it is only necessary to form a single contact portion for four cell transistors. For this reason, the number of contact portions can be reduced in comparison with the conventional memory device, and the area of the contact portions can be reduced in the case of forming a memory device of large capacity. When these memory cells are arranged in a matrix form, a selection transistor which is similar to the selection transistor ST in FIG. 10 is necessary. In this case, five transistors are used to form a memory cell which is include four cell transistors MC1 to MC4 and one selection transistor. That is, the number of transistors used increases by one in comparison with the prior art case, but if the number of series-connected cell transistors MC is increased, then increase in the pattern area due to the use of the selection transistor can be made smaller than that of the pattern area due to formation of the contact portions.

In the memory device according to the second embodiment of this invention, a plurality of cell transistors are serially connected to reduce the number of contact portions. Therefore, unlike the conventional UVEPROM having a plurality of cell transistors connected in parallel, it is impossible to use a method of programming data by injecting into the floating gate, electrons which are generated by impact ionization occurring near the drain when a high voltage is applied to the gate and drain of the cell transistor to cause a channel current. That is, in the memory device of this invention, a different method is used in which data is programmed by removing electrons from the floating gate or injecting holes into the floating gate to thereby set the threshold voltage negative.

Figure 27:
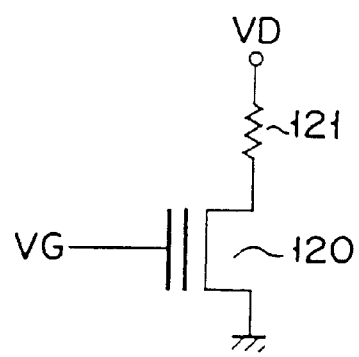
FIG. 27 is a diagram showing the circuit model formed to illustrate the operation of the circuit of FIG. 17.

FIG. 27 shows a circuit model in which the drain of MOSFET 120 is connected to voltage source VD through load circuit 121, and the source thereof is connected to the ground terminal. If control gate voltage VG of MOSFET 120 is set to 0 V and voltage VD is set at a high voltage level to cause breakdown near the drain of MOSFET 120, electrons are emitted from the floating gate to set the threshold voltage of MOSFET 120 negative.

Figure 28:
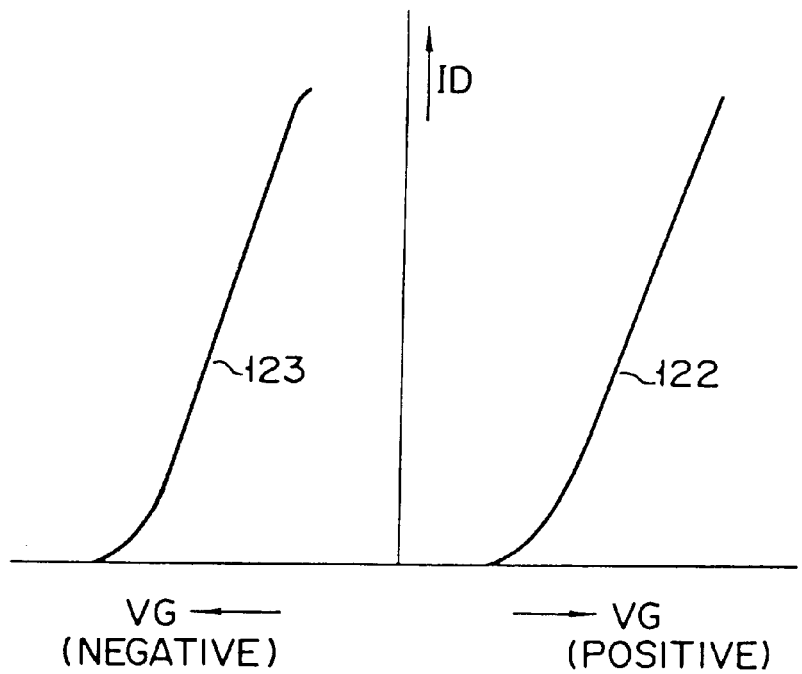
FIG. 28 is a diagram showing a voltage-current characteristic of a floating gate type MOSFET.

FIG. 28 is a characteristic diagram showing the voltage-current characteristic of floating gate type MOSFET. Characteristic curve 122 in the drawing shows the characteristic prior to occurrence of the breakdown, and in this case, drain current ID does not flow until the control gate voltage becomes higher than a preset positive voltage. In contrast, characteristic curve 123 shows the characteristic after occurrence of the breakdown, and in this case, drain current ID flows even when control gate voltage VG is negative. That is, after the breakdown has occurred in the circuit of FIG. 27, MOSFET 120 comes to have characteristic curve 123 and the threshold voltage is changed from a positive value to a negative value. Further, even in a case where the breakdown does not occur, and if punchthrough current flows, for example, when control gate voltage VG is low, the threshold voltage of MOSFET 120 may be changed to a negative value. An electric field between the drain and the floating gate of MOSFET 120 has an important function, and part of holes generated by the breakdown or punchthrough occuring near the drain is attracted by an electric field between the drain the floating gate and is injected into the floating gate. Thus, the floating gate may be charged to be positive, making the threshold voltage negative. In the second embodiment, it is important to lower control gate voltage VG, and holes can be injected into the floating gate because of use of low control gate voltage VG. With the use of patterns shown in FIGS. 21A, 21B, 22 to 25, 26A and 26B, breakdown will occur prior to punchthrough because of formation of high impurity concentration region 112-1, 112-2 or 112.

There will now be described an operation of the circuit of FIG. 19 with reference to FIGS. 29 and 30.

FIG. 29 shows a timing chart of the data programming, and in this example, data is programmed in cell transistor MC3 in period T1 and data is programmed in cell transistor MC2 in period T2. In period T1, selection voltages VG1, VG2 and VG4 are set to a high voltage level and selection voltage VG3 is set to a low voltage level of, for example, 0 V. Then, gate voltage Vin of MOSFET 101 is set to a high voltage to turn on MOSFET 101, permitting a high voltage of Vpp to be applied to one end of series circuit 100. Further, in series circuit 100, cell transistors MC1, MC2 and MC4 are turned on and cell transistor MC3 is turned off, and therefore a high voltage is applied to the drain of cell transistor MC3 which is in the off state. At this time, if Vpp and Vin are set to such values that breakdown or punchthrough may occur near the drain of cell transistor MC3, then breakdown or punchthrough occurs in cell transistor MC3. Since control gate voltage VG3 of cell transistor MC3 is set at 0 V, holes generated by the breakdown or punchthrough are injected into the floating gate. As a result, the threshold voltage of cell transistor MC3 is changed to a negative value, thus programming data in cell transistor MC3.

In period T2, selection Voltages VG1, VG3 and VG4 are set to a high voltage level and only selection voltage VG2 is set to a low voltage level of 0 V. At this time, gate voltage Vin of MOSFET 101 is kept at a high voltage. In this condition, breakdown or punchthrough will occur near the drain of cell transistor MC3, and then holes generated by the breakdown or punchthrough are injected into the floating gate, thus programming data in cell transistor MC3.

In general, it is well known that avalanche breakdown occurring near the drain is caused at a lower drain voltage when the gate voltage is set at a lower voltage. Therefore, the breakdown will occur when the control gate voltage is set at 0 V and will not occur when it is set at a high voltage level.

FIG. 30 shows a timing chart at the time of data readout, and in this example, data is sequentially read out from cell transistor MC1 to cell transistor MC4. In the data readout mode, a readout voltage lower than 5 V is applied to one end of series circuit 100 by a load circuit (not shown). Then, control gate voltage VG of a nonselected cell transistor is set to high voltage of, for example, 5 V, and control gate voltage VG of a selected cell transistor is set to a low voltage of, for example, 0 V. First, control gate voltage VG1 of cell transistor MC1 is set to 0 V and thus cell transistor MC1 is selected. If, for example, data is not programmed in cell transistor MC1 and the threshold voltage thereof is positive, then cell transistor MC1 is kept off. Therefore, no current flows in series circuit 100.

Next, control gate voltage VG2 of cell transistor MC2 is set to 0 V, and thus cell transistor MC2 is selected. If, for example, data is programmed in cell transistor MC2 and the threshold voltage thereof is negative, then cell transistor MC2 is turned on. Since, at this time, control gate voltages VG1, VG3 and VG4 of cell transistors MC1, MC3 and MC4 are set at a high voltage level, cell transistors MC1, MC3 and MC4 are all set in the conductive state. Therefore, current flows through series circuit 100. After this, control gate voltages VG3 and VG4 of cell transistors MC3 and MC4 are sequentially set to 0 V.

In the data readout operation, potential at one end of series circuit 100 varies according to the ON and OFF states of selected cell transistor MC, and data can be determined by detecting the potential variation by a sense amplifier or the like.

FIG. 31 is a circuit diagram showing a UVEPROM of plural-bit output construction according to another embodiment of this invention. The UVEPROM includes row decoder 131, column decoder 132 and m memory blocks 133-1 to 133-m. Each memory block 133 is formed with the same construction as memory block 133-1. That is, in each memory block 133, a plurality of series circuits 100 constructed by serially connecting n floating gate type cell transistors MC1 to MCn each having a control gate and a floating gate are arranged on rows and columns. Each of series circuits 100 is connected at one end to a corresponding one of column lines C1 to Cp through E-type MOSFET 134. The gates of MOSFETs 134 connected to series circuits 100 are respectively connected to row lines X1, X2, . . . to which decoded outputs of row decoder 131 commonly used for all memory blocks 133 are supplied, and the control gates of cell transistors MC1 to MCn in each series circuit 100 are connected to row lines W11, W12, . . . , W1n, W21, W22, . . . , M2n, . . . to which decoded outputs of row decoder 131 are supplied. Column lines C1 to Cp are connected commonly to data programming/readout node 136 through respective column selection E-type MOSFETs 32 whose gates are connected to column selection lines CS1 to CSp supplied with respective decoded outputs from column decoder 132 which is commonly used for all memory blocks 133.

Node 136 is connected programming voltage source Vpp through programming voltage applying E-type N-channel MOSFET 137 corresponding to MOSFET 101 in FIG. 19. Data input circuit 138 generates voltage Vin according to the programming data. Node 136 is also connected to data detection node 140 through potential isolation E-type MOSFET 139 whose gate is connected to receive preset vias voltage Vb. Data detection node 140 is connected to the drain and gate of E-type P-channel load MOSFET 141 whose source is connected to readout voltage source Vcc. Further, detection node 140 is connected to the input terminal of sense amplifier 142 which determines readout data and supplies this readout data to output buffer 143.

With the memory device of the above construction, it is only necessary to connect MOSFET 134 to column line C for every n cell transistors, and therefore it is possible to considerably reduce the number of contact portions required for connecting the memory cells to the column lines. As a result, the area occupied by the contact portions can be reduced, and the chip size for large memory capacity can be considerably reduced, thus lowering the manufacturing cost.

Now, the operation of the above memory device is explained.

Figure 32:
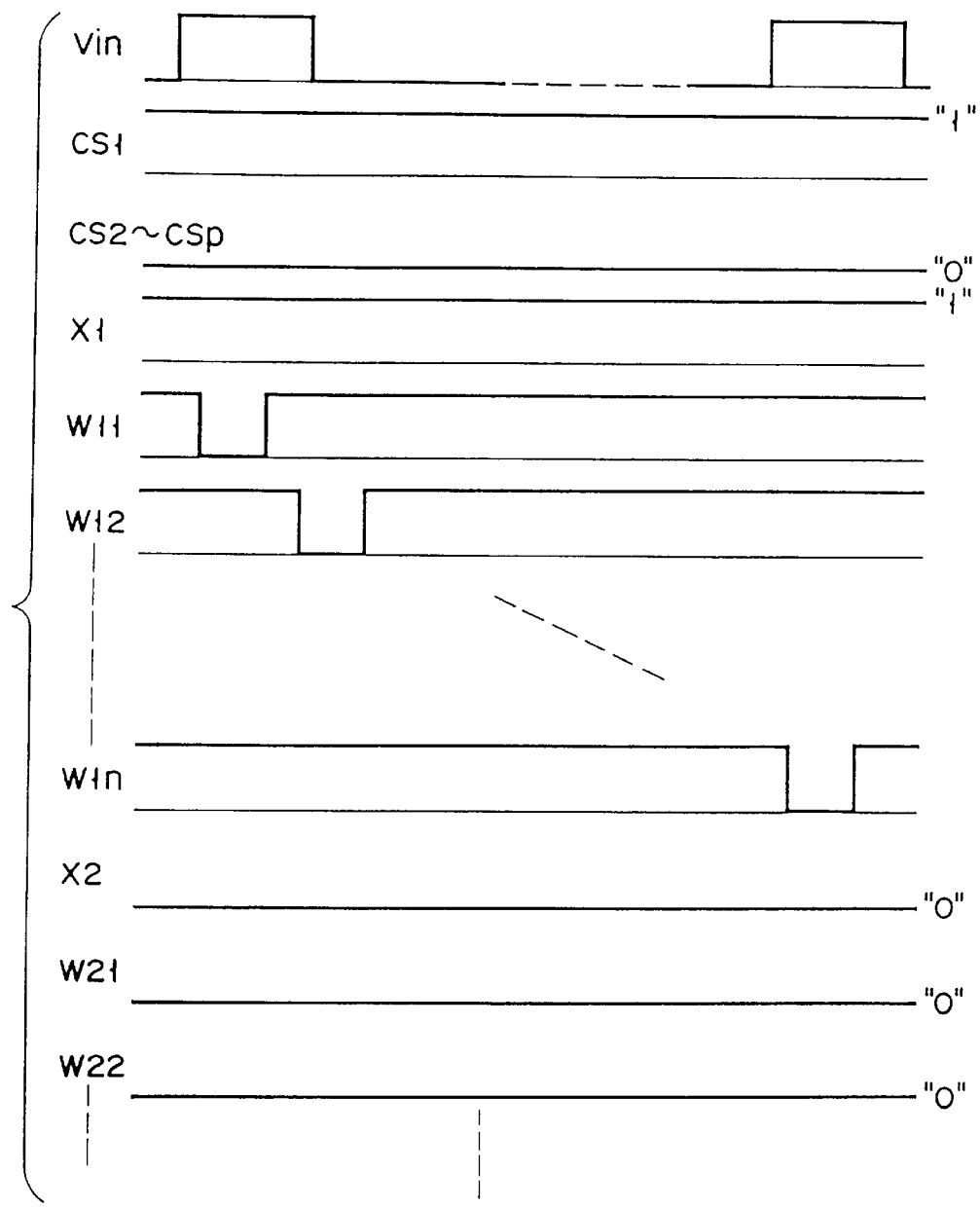

FIG. 32 is a timing chart showing one example of data programming operation in the memory device. In this example, series circuit 100 connected to row lines X1, W11 to W1n and column C1 is selected and data is programmed in the cell transistors of selected series circuit 100. In this case, only column selection line CS1 is set to a high voltage level by decoded outputs from column decoder 132 to turn on column selection MOSFET 135-1 connected to column line C1. At this time, other column selection lines CS2 to CSp are all set to a low voltage level, and the remaining column selection MOSFETs 135-2 to 135-p connected to column lines C2 to Cp are turned off. Further, only row line X1 among row lines X1, X2, . . . is set to a high voltage level by decoded outputs of row decoder 131, and series circuit selection MOSFETs 134 which are connected to series circuits 100 arranged on the same row are turned on. Then, only row line W11 is set to a low voltage level by decoded outputs of row decoder 131. At this time, if output voltage Vin of data input circuit 138 is set at a high voltage level, MOSFET 137 is turned on to permit high programming voltage Vpp to be applied to node 136. The high voltage applied to node 136 is applied to column line C1 through column selection MOSFET 135-1 which is set in the conductive state. As a result, the breakdown will occur near the drain of cell transistor MC1 of selected series circuit 100 and holes are injected into the floating gate thereof, thus programming data in the cell transistor.

After this, only row line W12 is set to a low voltage level by decoded outputs of row decoder 131. At this time, if output voltage Vin of data input circuit 138 is set at a low voltage level, no hole is injected into the floating gate of memory cell MC2 connected to row line W12. The control gate voltage of the cell transistor in which no hole is injected is set at a low voltage level. This is because row lines X and W are commonly used for all memory blocks 133 and it may become necessary to inject holes into the floating gate of a corresponding cell transistor in each of other memory blocks.

Then, the remaining row lines are sequentially set to a low voltage and voltage Vin is set to a voltage level corresponding to the programming data in the same manner as described above. Thus, data can be programmed in n cell transistors of selected series circuit 100.

At this time, in order to prevent the breakdown from occurring in the series circuits on the nonselected rows, it is necessary to decide the impurity concentration of the drain region in each MOSFET 134 so as to set the starting voltage of the avalanche breakdown caused by an electric field between the gate and drain higher than that of the memory cell.

FIG. 33 is a timing chart of different voltage waveforms of signals on row lines W11 to W1n in the data programming operation. In the timing chart of FIG. 32, the row line is normally set at a high voltage level and set at a low voltage level for a preset period of time when data is programmed in the selected cell transistor. However, in this example, row lines W1n to W11 are sequentially set to a low voltage level in this order, thus causing holes to be injected in the order from cell transistor MCn to cell transistor MC1.

Further, in the operation shown by the timing chart of FIG. 32, the row line is normally set at a high voltage level, for example, 20 V, and is set at a low voltage level, for example, 0 V for a preset period of time in the data programming mode. However, it is possible to set the row lines at a voltage, for example, 5 V which is lower than 20 V when no cell transistor is selected as shown by the timing chart of FIG. 34, thus reducing the voltage stress on the cell transistors.

In the readout operation in the memory device of FIG. 31, one of row lines X1, X2, . . . connected to the selected cell transistor is set to a high voltage level of, for example, 5 V, and one of row lines W11, W12, W13, . . . , W1n, W21, W22, W23, . . . , W2n, . . . connected to the selected cell transistor is set to a low voltage level. The remaining row lines are all set to the high voltage level, and cell transistors connected to the remaining row lines are all turned on. At this time, the selection cell transistors connected to the row lines set at the low voltage level are turned on or off according to the threshold voltages thereof. Then, node 140 is kept charged by means of MOSFET 141 or is discharged according to the conduction state of the selection cell transistor. The potential variation on the node 140 is detected by means of sense amplifier 142 which in turn supplies an output as readout data to the external through output buffer 143.

Figure 35:
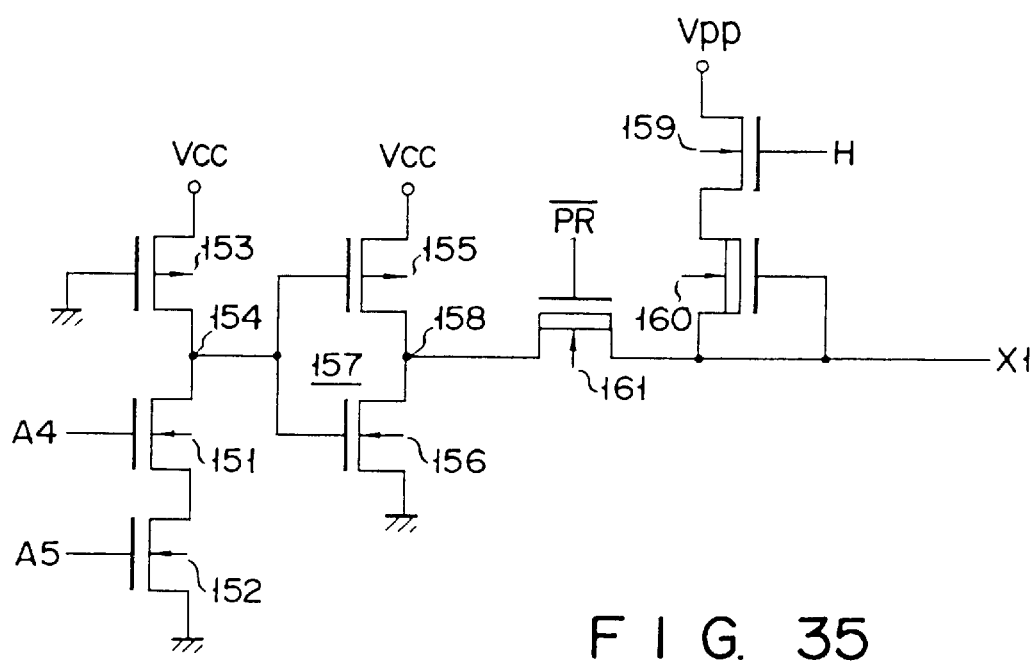
FIGS. 35 and 36 are circuit diagrams showing the detail construction of a row decoder in the memory device of FIG. 31.

FIG. 35 is a circuit diagram showing the detail construction of a decoding section used in row decoder 131 of the memory device of FIG. 31 to set the voltage of row line X1. In this example, six bit-signals A0 to A5 are supplied as address signals, four series circuits 100 are provided for each column line C, and each series circuit 100 is constituted by 16 cell transistors.

The decoding section for setting the voltage of row line X1 is connected to receive address signals A4 and A5. When both address signals are set at "1", N-channel MOSFETs 151 and 152 are turned on so that node 154 connected to voltage source Vcc through P-channel MOSFET 153 which is normally set in the ON state may be set to "0". As a result, a signal on output node 158 of inverter 157 formed of P-channel MOSFET 155 and N-channel MOSFET 156 and connected to receive a signal from node 154 is set to "1".

In the data programming mode, signal $\overline{PR}$ is set at 0 V and signal H is set at a high voltage level. Therefore, row line X1 is charged by high voltage Vpp through N-channel MOSFET 159 and depletion type (D-type) N-channel MOSFET 160. Since, at this time, the gate of D-type N-channel MOSFET 161 connected between node 158 and row line X1 is set at 0 V, no current will flow from row line X1 which is coupled to voltage source Vpp towards node 158.

In the data readout mode, signal PR is set at 5 V, for example. Since, at this time, high voltage Vpp is not supplied, signal "1" on output node 158 of inverter 157 is transmitted as it is to row line X1.

In other decoding sections (not shown) for setting voltages of other row lines X2, X3 and X4, combination signals of address signals $\overline{A4}$ and A5, address signals A4 and $\overline{A5}$ and address signals $\overline{A4}$ and $\overline{A5}$ are supplied to N-channel MOSFETs 151 and 152. When input address signals are both set at "1", a signal of high voltage level or "1" level is supplied from a corresponding row line.

Figure 36:
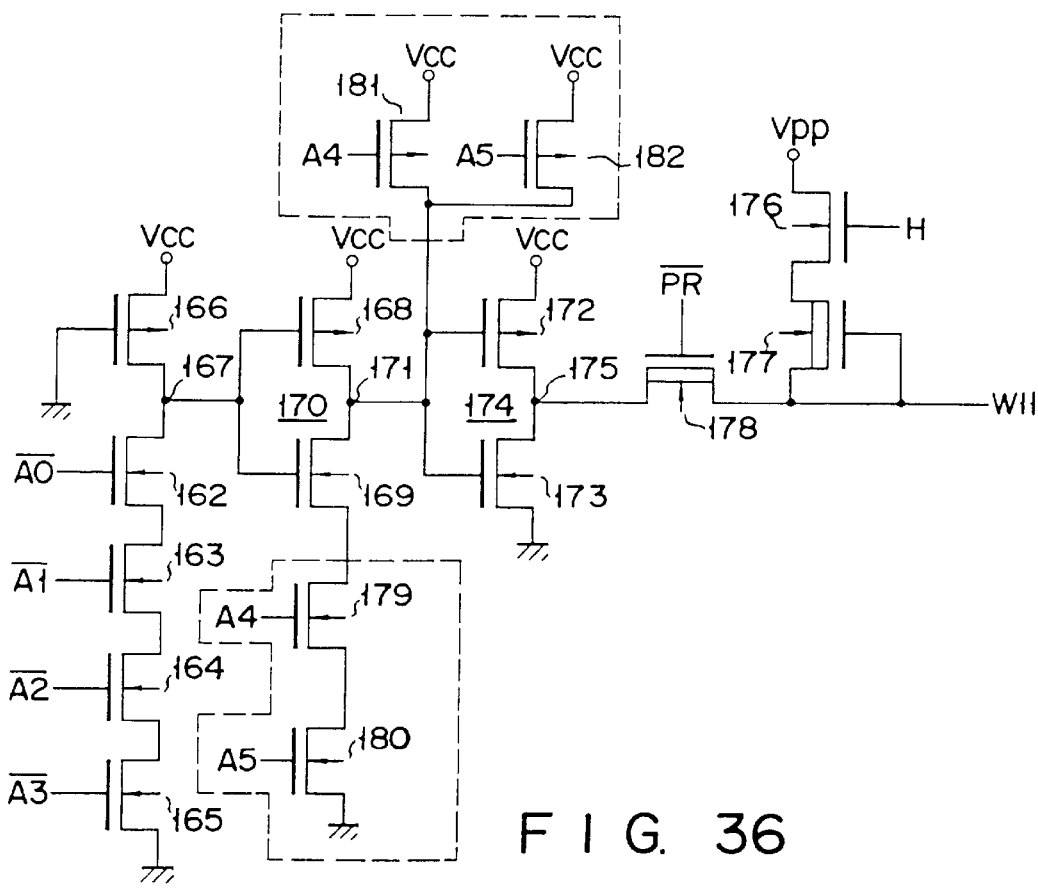

FIG. 36 is a circuit diagram showing the detail construction of a decoding section used in row decoder 131 of FIG. 31 to set a voltage of row line W11. The decoder section is connected to receive address signals $\overline{A0}$, $\overline{A1}$, $\overline{A2}$ and $\overline{A3}$. When all the input addresses are set at "1", N-channel MOSFETs 162, 163, 164 and 165 are turned on and node 167 connected to voltage source Vcc through P-channel MOSFET 166 which is normally set in the ON state is set to "0". As a result, a signal on output node 171 of inverter 170 formed of P-channel MOSFET 168 and N-channel MOSFET 169 and connected to receive the signal on node 167 is set to "1", and a signal on output node 175 of inverter 174 formed of P-channel MOSFET 172 and N-channel MOSFET 173 and connected to receive the signal on output node 171 of inverter 170 is set to "0" level.

In the data programming mode, signal PR is set at 0 V and signal H is set at a high voltage level. As a result, row line W11 is charged through N-channel MOSFET 176 and D-type N-channel MOSFET 177 by high voltage Vpp. Since, at this time, the signal on output node 175 of inverter 174 is set at "0", current flows from row line W11 towards node 175 through D-type N-channel MOSFET 178, setting row line W11 to a low voltage level or 0 V. In contrast, when any one of address signals $\overline{A0}$, $\overline{A1}$, $\overline{A2}$ and $\overline{A3}$ is set at "0", output node 175 of inverter 174 is set to "1", thereby charging row line W11 by high voltage Vpp. That is, in the data programming mode, row line W11 is set at 0 V at the time of selection and at high voltage Vpp at the time of nonselection.

In the data readout mode, signal $\overline{PR}$ is set at 5 V. Since, at this time, high voltage Vpp is not supplied, a signal on output node 175 of inverter 174 is supplied as it is to row line W11.

In other decoding sections (not shown) for setting voltage of row lines W12, . . . and W110 to W116 (n=16), address signals A9 to A3 and $\overline{A9}$ to $\overline{A3}$ of a different combination are supplied to the gates of N-channel MOSFETs 162, 163, 164 and 165. In the data programming mode, when all the address signals are set at "1", an output voltage of 0 V is supplied from a corresponding row line.

The FIG. 36 circuit can be constituted to contain N-channel MOSFETs 179 and 180 and P-channel MOSFETs 181 and 182 which are surrounded by broken lines in the drawing. Addition of the MOSFETs causes an output signal of "1" or "0" to be supplied through row line W11 according to the logic levels of address signals A9 to A3 only when address signals A4 and A5 are set to "1" to set row line X1 at "1" level. When row line X1 is not selected, that is, when row line X1 is set at "0", row line W11 is always set at "0" so that a row line connected to a group of series-connected cell transistors which are not selected can be set at "0", enhancing the reliability. However, if it is required to reduce the number of MOSFETs used, it is possible to omit these MOSFETs.

Figure 37:
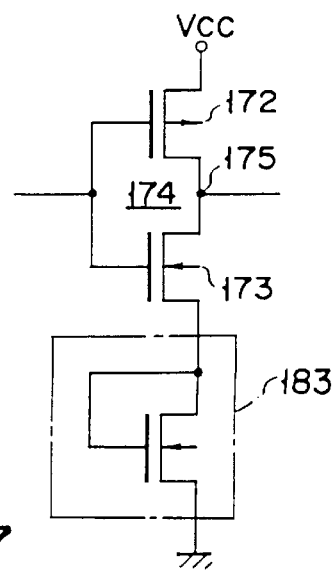
FIG. 37 is a circuit diagram showing a modification of the circuit of FIG. 36.

In the FIG. 36 circuit, when row line W11 is selected in the data programming mode, the voltage thereof is set at 0 V. In a case where data is programmed by causing breakdown, no problem will occur, but it is preferable to set the voltage to approx. 1 V when data programming is effected by causing punchthrough. In this case, as shown in FIG. 37, bias circuit 183 is connected between MOSFET 173 of inverter 174 in FIG. 36 and the ground terminal, and the source voltage of N-channel MOSFET 173 may be set to the threshold voltage of a cell transistor which is not programmed, for example, 1 V. Bias circuit 183 can be constituted by an N-channel MOSFET whose gate and drain are connected together as shown in FIG. 37.

Further, use of the circuit of FIG. 37 increases current flowing in a cell transistor which is turned on in the data readout mode, enlarging the readout margin.

Figure 38:
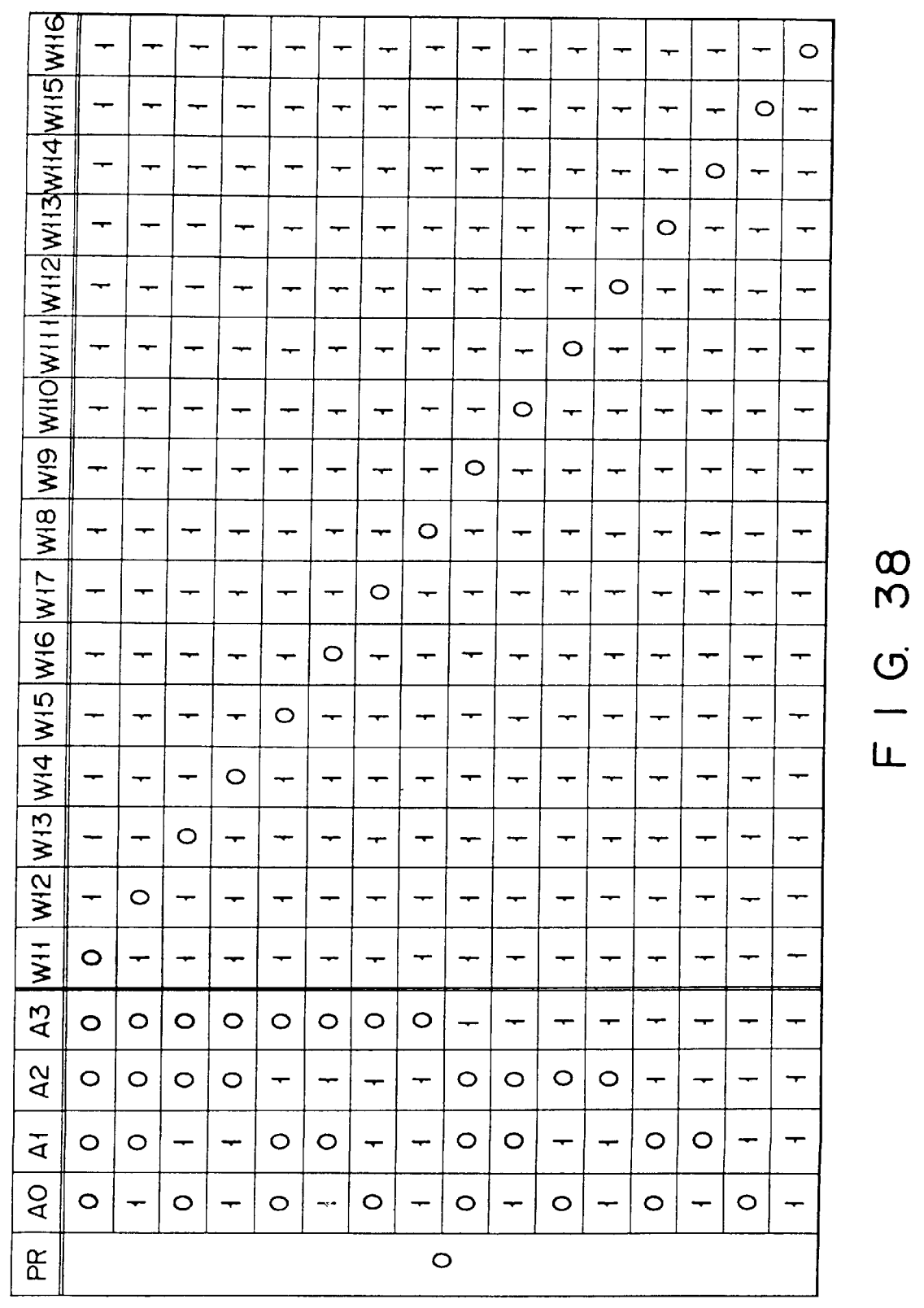

FIG. 38 is a diagram showing the truth values corresponding to the output states of row decoder 131 which generates output signals of the waveforms shown in FIG. 32. Programming signal PR is set at "0" in the data readout mode. One of 16 row lines W11 to W116 is set to "0" according to variation in address signals A0 to A3. Row decoder 131 can be formed only to satisfy the output condition set up by the truth values.

FIG. 39 is a diagram showing the truth table corresponding to the output states of row decoder 131 which generates output signals of the waveforms shown in FIG. 33 in the data programming mode. 16 row lines W11 to W116 are sequentially set to 0 V in the order from W116 to W11 according to variation in address signals A0 to A3. Row decoder 131 can be formed only to satisfy the condition determined by the truth table. At this time, the readout or data programming mode is determined based on signal PR, and when signal PR is at "0" indicating the readout mode, row decoder 131 is constituted to satisfy the truth table condition shown in FIG. 38.

Figure 40:
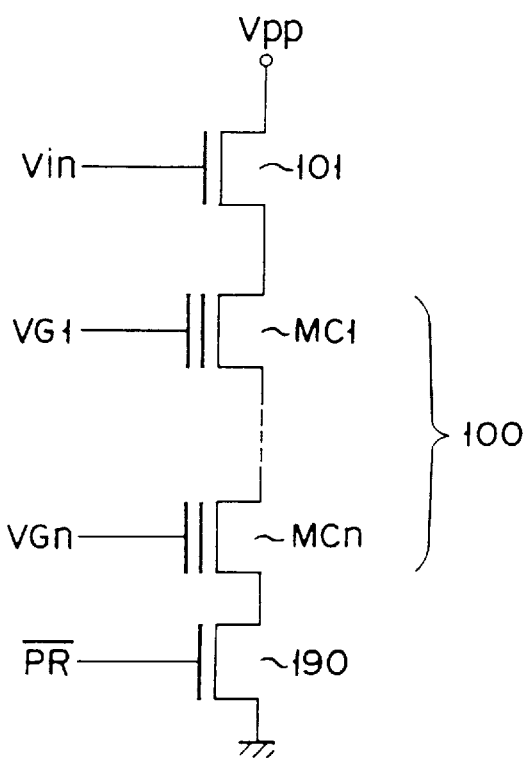
FIG. 40 is a circuit diagram showing a modification of the circuit of FIG. 19.

FIG. 40 is a circuit diagram showing the modified construction of the circuit shown in FIG. 19. In the memory device of the FIG. 19 embodiment, the other end of each series circuit 100 or the source of cell transistor MCn is connected to the ground terminal. In contrast, in the memory device of the FIG. 40 embodiment, the other end of each series circuit 100 is connected to the ground terminal through MOSFET 190 having a gate connected to signal line $\overline{PR}$ which is set at a low voltage level in the data programming mode. With this construction, substantially no current flows through series circuit 100 in the data programming mode, and thus the drain voltage of the cell transistor can be prevented from being lowered. Therefore, holes can be efficiently injected into the floating gate thereof. MOSFET 190 can be provided for each series circuit 100, but it is also possible to provide a single MOSFET 190 commonly for a plurality of series circuits 100.

According to the second embodiment described above, a nonvolatile semiconductor memory device can be obtained in which the chip size can be reduced by reducing the number of contact holes and the manufacturing cost can be lowered.

However, since cell transistors are connected tin series in the UVEPROM shown in FIG. 19, current flowing in each cell transistor becomes small in comparison with the conventional UVEPROM.

The operation speed of reading out data from the cell transistor depends on current flowing in the cell transistor, and data readout speed increases as the cell current increases. Since data is read out form the cell transistor by detecting a potential at one end of the series circuit 100 of cell transistors by use of a sense amplifier circuit, it becomes important to charge or discharge one end of the series circuit 100 as quickly as possible in order to enhance the data readout speed. For example, if the channel width and channel length are set to W and L, respectively, current flowing in one cell transistor varies in proportion to W/L. In a case where series circuit 100 is formed of four cell transistors as shown in FIG. 19, current which can flow in series circuit 100 is equal to or less than one-fourth the current flowing in each cell transistor.

For this reason, it is preferable to lower the threshold voltage of each cell transistor in the UVEPROM of FIG. 19 in order to enhance the readout speed. That is, the memory cell current becomes larger as the threshold voltage becomes lower, and the data readout speed becomes higher. In general, in order to lower the threshold voltage, the impurity concentration of the channel region will be lowered. However, in order to lower the breakdown voltage and improve the programming characteristics, it is necessary to increase the impurity concentration of the channel region. That is, when the impurity concentration of the channel region is high, the breakdown will occur at a lower voltage. Therefore, if the impurity concentration of the channel region is lowered to enhance the data readout speed, the breakdown voltage becomes high and the programming characteristics will be deteriorated.

As described above, the impurity concentration of the channel region in the cell transistor is an important factor for both characteristics, the data readout speed and programming characteristics. That is, the two characteristics may be improved and deteriorated, or vice versa when the impurity concentration is set low or high, respectively. Therefore, it is necessary to make a compromise between the two characteristics.

For the reasons described above, in the patterns of FIGS. 21A, 23 to 25, and 26A, part of the channel region which is formed in contact with the drain region has a higher impurity concentration than the other regions.

Since part of the channel region is formed to have a higher impurity concentration than the other regions, a breakdown may easily occur between the high impurity concentration region and the drain region, thus lowering the breakdown voltage. Since, in this case, the other part of the channel region can be formed to have a sufficiently low impurity concentration, the threshold voltage can be set at a low voltage, permitting a sufficiently large memory cell current.

Further, impurity concentration of the portion other than the high impurity concentration region is set to such a low value that each cell transistor can have a low threshold voltage and may permit a sufficiently large channel current flow.

The same portions in FIG. 21A as those in FIG. 20 are denoted by the same reference numerals. High impurity concentration regions 112-1 and 112-2 are formed in those portions of channel region 111 which lie in contact with field portions 110-1 and 110-2. FIG. 21B is a cross sectional view of a semiconductor device taken along line 21B—21B of the pattern of FIG. 21A. The semiconductor device has P-type substrate 102 and floating gate 105-4 formed on insulation layer 108 which in turn is formed on substrate 102. Further, control gate 106-4 is formed on insulation layer 109 which in turn is formed on floating gate 105-4. For example, floating gate 105-4 is formed of polycrystalline silicon, and control gate 106-4 is formed of polycrystalline silicon or metal. High impurity concentration regions 112-1 and 112-2 containing, at a high impurity concentration, P-type impurity which is the same as that of the substrate are formed in channel region 111 which is divided by means of the field portions 110-1 and 110-2 of insulation films 108 and 109.

With the above construction, a breakdown may easily occur between the drain region and high impurity concentration 112-1 and 112-2 of each channel region 111, and thus the breakdown voltage can be lowered. Further, since portion of channel region 111 other than high impurity concentration regions 112-1 and 112-2 is formed to have a low impurity concentration and the threshold voltage is set to a low voltage, a channel current flowing each cell transistor can be increased. As a result, both of the data readout speed and programming characteristics in the memory device of this embodiment can be enhanced at the same time.

In the memory device described above, high impurity concentration regions 112-1 and 112-2 are formed in two portions of channel region 111 in contact with the opposite field portions 110-1 and 110-2 of insulation layer 108. This is because misalignment will occur when an ion-implantation mask is formed. That is, when the mask is formed, patterns surrounded by broken lines are first formed on an ion shielding member (not shown) so as to expose ion-implanted regions as shown in the pattern plan view of FIG. 22. Then, portion of the shielding member except those on which the patterns are formed is removed. That is, portions 113 and 114 of the shielding member surrounded by broken lines as shown in FIG. 22 are removed to form the ion-implantation mask. In this case, even if the pattern is deviated on the shield member rightwards or leftwards in the drawing, the total contact area between the drain region and high impurity concentration region 125 formed in the following step can be kept constant. As a result, variation in channel current can be suppressed in this embodiment.

The breakdown between the drain region and high impurity concentration region 112-1 and 112-2 occurs in the form of junction breakdown when the impurity concentration of high impurity concentration regions 112-1 and 112-2 are set extremely high, the operation thereof cannot be controlled by the gate potential. Therefore, it is necessary to set the impurity concentration of high impurity concentration regions 112-1 and 112-2 in such a range that the gate control can be made effective. That is, it is sufficient to ion-implant impurity at an impurity concentration slightly higher than that of the channel region into which impurity is ion-implanted to control the threshold voltage. As is well known in the art, a breakdown is caused by an electric field between the gate and drain of an ordinary MOSFET in a portion directly under the drain region thereof at a voltage lower than that at which the breakdown occurs in an ordinary PN junction. The breakdown voltage becomes high as the gate voltage becomes high, and the same breakdown as the junction breakdown occurs when the gate voltage has reached a certain high voltage level. Therefore, it is preferable to set the impurity concentration of high impurity concentration regions 112-2 and 112-2 in such a range that the breakdown voltage can be controlled by the gate voltage.

FIGS. 23 to 25, and 26A and 26B show other pattern plan views of series circuit 100 shown in FIG. 19.

In the pattern of FIG. 23, a high impurity concentration region corresponding to high impurity concentration regions 112-2 and 112-2 shown in FIGS. 21A and 21B is formed on the entire portion of channel region 111 which is positioned in contact with the drain regions 103-2 to 103-5. That is, high impurity concentration region 112A is formed in contact with drain region 103-2. Likewise, high impurity concentration regions 112B to 112D are formed in contact with drain regions 103-3 to 103-5.

In the pattern of FIG. 24, high impurity concentration regions 112-2 and 112-2 are formed in two portions of channel region 111 which are positioned in contact with the drain region and the field insulation layer.

In the pattern of FIG. 25, high impurity concentration region 112 is formed only at the center of that portion of channel region 111 which is positioned in contact with the drain region.

In the pattern of FIG. 26A, high impurity concentration region 112 is formed only at the center of that portion of channel region 111 which is positioned in contact with the drain region, and it is formed in a triangle form. In a case where high impurity concentration region 112 is formed in a triangle form, part of a pattern shown by broken lines in FIG. 26B can be used as a pattern for forming the ion-implantation mask, making it easy to form the mask.

A process of ion-implanting impurity into the channel region to control the threshold voltage can be omitted by suitably setting the impurity concentration of the semiconductor wafer on which the above memory cell is formed. Therefore, it is only necessary to ion-implanting impurity into channel region 111 to form high impurity concentration regions 112-1, 112-2 and 112. For example, in a case where the memory device is formed on the semiconductor wafer having the substrate resistivity of 10 Ω·cm, a threshold voltage of approx. 0 V can be obtained without ion-implanting impurity into the channel region. It is preferable that a cell transistor in which data is not programmed is turned off when it is selected and permits a larger current to flow when it is not selected. For this reason, it is preferable to set the threshold voltage to approx. 0 V.

In UVEPROM having series-connected memory cells and formed with the above pattern structure, the data readout speed and programming characteristic can be enhanced to a satisfactory degree.

What is claimed is:

1. A semiconductor memory device comprising:
    a memory cell array having a plurality of memory cells arranged in a matrix form, each of the memory cells having a charge accumulation layer to store charges, an amount of the charges represents data stored, and each of the memory cells being subject to a data program, a data read and a data erasure;
    a plurality of word lines connected to the memory cells in the same rows for selecting the memory cells;
    a plurality of bit lines connected to the memory cells in the same columns;
    a voltage boosting circuit formed integrally in the semiconductor memory device for receiving a power supply voltage and for generating a high level voltage, the level of which is higher than the power supply voltage;
    a decoding circuit for receiving address signals and for generating a selection signal in response to the address signals;
    a plurality of transfer gates, each of the transfer gates being connected between an output of the decoding circuit an a corresponding one of the word lines, and each of the transfer gates having a gate electrode;
    wherein the gate electrode of the transfer gates is supplied with a first level voltage when at least one of the memory cells are subject to the data read, and is supplied with the high level voltage when at least one of the memory cells are subject to the data program, and wherein the level of the high level voltage is higher than the level of the first level voltage.

2. The semiconductor memory device according to claim 1 further comprising:
    a selection circuit for receiving a second selection signal, the high level voltage and the first level voltage, and for supplying a voltage from the high level voltage or the first level voltage to the gate electrode in response to the second selection signal.

3. The semiconductor memory device according to claim 1 wherein the selection signal is a first level when the memory cells are subject to data read and a second level when the memory cells are subject to data program.

4. The semiconductor memory device according to claim 1 further comprising:
    a plurality of high voltage supply switches connected between a terminal supplied with a first high level voltage and a corresponding one of the bit lines, for supplying the first high level voltage to the corresponding one of the bit lines for selectively programming the memory cells.

5. The semiconductor memory device according to claim 4 wherein the plurality of high voltage supply switches selectively transfer the high level voltage when the memory cells are subject to the data program.

6. The semiconductor memory device according to claim 4 wherein each of the plurality of high voltage supply switches includes a MOS transistor having a gate electrode supplied with a second high level voltage.

7. The semiconductor memory device according to claims 1, 2, 3, 4, 5 or 6 wherein the level of the first level voltage is higher than the level of the power supply voltage.

8. A semiconductor memory device comprising:
    a memory cell array having a plurality of memory cells arranged in a matrix form, each of the memory cells having a charge accumulation layer to store charges, an amount of the charges represents data stored, and each of the memory cells being subject to at least a first operation mode and a second operation mode;
    a plurality of word lines connected to the memory cells in the same rows for selecting the memory cells;
    a plurality of bit lines connected to the memory cells in the same columns;
    a voltage boosting circuit formed integrally in the semiconductor memory device for receiving a power supply voltage and for generating a high level voltage, the level of which is higher than the power supply voltage;
    a decoding circuit for receiving address signals and for generating a selection signal in response to the address signals;

a plurality of transfer gates, each of the transfer gates being connected between an output of the decoding circuit and a corresponding one of the word lines, and each of the transfer gates having a gate electrode;

wherein the gate electrode of the transfer gates is supplied with a first level voltage during the first operation mode, and is supplied with the high level voltage during the second operation mode, and wherein the level of the high level voltage is higher than the level of the first level voltage.

9. The semiconductor memory device according to claim 8 further comprising:

a selection circuit for receiving a second selection signal, the high level voltage and the first level voltage, and for supplying a voltage from the high level voltage or the first level voltage to the gate electrode in response to the second selection signal.

10. The semiconductor memory device according to claim 8 wherein the selection signal is a first level during the first operation mode and a second level during the second operation.

11. The semiconductor memory device according to claim 8 further comprising:

a plurality of high voltage supply switches connected between a terminal supplied with a first high level voltage and corresponding one of the bit lines, for supplying the first high level voltage to the corresponding one of the bit lines.

12. The semiconductor memory device according to claim 8 wherein the plurality of high voltage supply switches selectively transfer the high level voltage during second mode.

13. The semiconductor memory device according to claim 8 wherein each of the plurality of high voltage supply switches includes a MOS transistor having a gate electrode supplied with a second high level voltage.

14. The semiconductor memory device according to claims 8, 9, 10, 11, 12 or 13 wherein the level of the first level voltage is higher than the level of the power supply voltage.

15. The semiconductor memory device according to claims 8, 9, 10, 11, 12 or 13 wherein the level of the first level voltage is the same as the level of the power supply voltage.

* * * * *

UNITED STATES PATENT AND TRADEMARK OFFICE
CERTIFICATE OF CORRECTION

PATENT NO.     : 6,178,116 B1
DATED          : January 23, 2001
INVENTOR(S)    : Hiroshi Iwahashi It is certified that error appears in the above-identified patent and that said Letters Patent is hereby corrected as shown below:

Column 22,
Line 10, "circuit an a" should read -- circuit and a --.

Column 24,
Lines 6-7, "claim 8" should read -- claim 11 --.
Lines 10-11, "claim 8" should read -- claim 11 --.

Signed and Sealed this

Eighteenth Day of November, 2003

JAMES E. ROGAN
*Director of the United States Patent and Trademark Office*